(12) United States Patent
Hayashi et al.

(10) Patent No.: US 7,128,976 B2
(45) Date of Patent: Oct. 31, 2006

(54) COMPOSITION FOR FILM FORMATION, METHOD OF FILM FORMATION, AND SILICA-BASED FILM

(75) Inventors: Eiji Hayashi, Mie (JP); Kouichi Hasegawa, Ibaraki (JP); Youngsoo Seo, Chungchongnam-Do (KR); Michinori Nishikawa, Mie (JP); Kinji Yamada, Ibaraki (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 10/269,967

(22) Filed: Oct. 15, 2002

(65) Prior Publication Data

US 2003/0091838 A1 May 15, 2003

Related U.S. Application Data

(63) Continuation-in-part of application No. 09/827,902, filed on Apr. 9, 2001, now Pat. No. 6,495,264.

(30) Foreign Application Priority Data

Nov. 29, 2000 (JP) .......................... P. 2000-363513
Apr. 10, 2001 (JP) .......................... P. 2000-108311

(51) Int. Cl.
*B32B 25/20* (2006.01)

(52) U.S. Cl. .................. 428/447; 426/387; 528/21; 524/588

(58) Field of Classification Search ............... 524/588; 528/21; 428/447; 427/387

See application file for complete search history.

(56) References Cited

U.S. PATENT DOCUMENTS

| | | | | |
|---|---|---|---|---|
| 4,214,057 A | | 7/1980 | Ishihara et al. | |
| 4,555,545 A | * | 11/1985 | Kimura et al. | 524/858 |
| 4,624,870 A | * | 11/1986 | Anthony | 427/387 |
| 5,013,800 A | * | 5/1991 | Inoue | 525/477 |
| 5,091,460 A | * | 2/1992 | Seto et al. | 524/492 |
| 5,225,510 A | * | 7/1993 | Bank et al. | 528/12 |
| 5,605,997 A | * | 2/1997 | Yamamoto et al. | 528/10 |
| 5,662,961 A | * | 9/1997 | Tanitsu et al. | 427/58 |
| 6,410,150 B1 | | 6/2002 | Kurosawa et al. | |
| 6,410,151 B1 | | 6/2002 | Kurosawa et al. | |
| 6,413,647 B1 | | 7/2002 | Hayashi et al. | |
| 6,472,079 B1 | | 10/2002 | Hayashi et al. | |
| 6,495,264 B1 | | 12/2002 | Hayashi et al. | |
| 6,558,747 B1 | | 5/2003 | Nakata et al. | |

FOREIGN PATENT DOCUMENTS

| | | |
|---|---|---|
| EP | 0 226 208 | 6/1987 |
| JP | 11-340219 | 12/1999 |
| JP | 11-340220 | 12/1999 |

OTHER PUBLICATIONS

U.S. Appl. No. 10/270,066, filed Oct. 15, 2002, Shiota et al.
U.S. Appl. No. 10/103,996, filed Mar. 25, 2002, Hayashi et al.
U.S. Appl. No. 10/165,324, filed Jun. 10, 2002, Hayashi et al.
U.S. Appl. No. 10/269,967, filed Oct. 15, 2002, Hayashi et al.

* cited by examiner

*Primary Examiner*—Kuo-Liang Peng
(74) *Attorney, Agent, or Firm*—Oblon, Spivak, McClelland, Maier & Neustadt, P.C.

(57) ABSTRACT

A composition for film formation which comprises:
(A) a product of hydrolysis and condensation obtained by hydrolyzing and condensing at least one silane compound selected from the group consisting of compounds represented by the formula (1), compounds represented by the formula (2), and compounds represented by the formula (3) in the presence of water and an ammonium compound, and
(B) an organic solvent.

8 Claims, No Drawings

COMPOSITION FOR FILM FORMATION, METHOD OF FILM FORMATION, AND SILICA-BASED FILM

CROSS-REFERENCE TO THE RELATED APPLICATION

This application is a continuation-in-part application of U.S. patent application Ser. No. 09/827,902 filed Apr. 9, 2001 now U.S. Pat. No. 6,495,264, entitled "COMPOSITION FOR FILM FORMATION, METHOD OF FILM FORMATION, AND SILICA-BASED FILM".

FIELD OF THE INVENTION

The present invention relates to a composition for film formation. More particularly, the invention relates to a composition for film formation which, when used as an interlayer insulating film material in the production of semiconductor devices and the like, can give a silica-based film excellent in dielectric constant characteristics after a PCT (pressure cooker test), resistance to CMP (chemical mechanical polishing) after a PCT, and adhesion to substrates after a PCT.

BACKGROUND OF THE INVENTION

Silica ($SiO_2$) films formed by vacuum processes such as the CVD method have hitherto been used frequently as interlayer insulating films in semiconductor devices and other devices. In recent years, an insulating coating film which comprises a tetraalkoxysilane hydrolyzate as the main component and is called an SOG (spin on glass) film has come to be used for the purpose of forming a more even interlayer insulating film. Furthermore, as a result of the trend toward higher degree of integration in semiconductor devices and the like, an interlayer insulating film called an organic SOG film has been developed which comprises a polyorganosiloxane as the main component and has a low dielectric constant.

With further progress in the degree of integration or multilayer constitution especially in semiconductor devices and the like, better electrical insulation between conductors has come to be required and, hence, an interlayer insulating film material having a lower dielectric constant and excellent cracking resistance has come to be desired.

Proposed as materials having a low dielectric constant are a composition comprising a mixture of fine particles obtained by condensing an alkoxysilane in the presence of ammonia and a basic product of partial hydrolysis of an alkoxysilane (see JP-A-5-263045 (the term "JP-A" as used herein means an "unexamined published Japanese patent application") and JP-A-5-315319) and a coating fluid obtained by condensing a basic hydrolyzate of a polyalkoxysilane in the presence of ammonia (see JP-A-11-340219 and JP-A-11-340220). However, the materials obtained by these methods are unsuitable for industrial production because the reaction products have unstable properties and the films obtained therefrom have considerable unevenness of properties such as dielectric constant characteristics after a PCT, resistance to CMP after a PCT, and adhesion to substrates after a PCT.

SUMMARY OF THE INVENTION

An object of the invention is to provide a composition for film formation which eliminates the problems described above. More particularly, the object is to provide a composition for film formation which, when used in the production of semiconductor devices and the like, can give an interlayer insulating film excellent in dielectric constant characteristics after a PCT, resistance to CMP after a PCT, and adhesion to substrates after a PCT. Another object of the invention is to provide a silica-based film obtained from the composition.

The invention provides a composition for film formation which comprises:

(A) a product of hydrolysis and condensation obtained by hydrolyzing and condensing at least one silane compound selected from the group consisting of compounds represented by the following formula (1) (hereinafter referred to as "compounds (1)"), compounds represented by the following formula (2) (hereinafter referred to as "compounds (2)"), and compounds represented by the following formula (3) (hereinafter referred to as "compounds (3)") in the presence of water and an ammonium compound, $$R_a Si(OR^1)_{4-a} \quad (1)$$

wherein R represents a hydrogen atom, a fluorine atom, or a monovalent organic group; $R^1$ represents a monovalent organic group; and a Is an integer of 1 or 2;

$$Si(OR^2)_4 \quad (2)$$

wherein $R^2$ represents a monovalent organic group;

$$R^3{}_b(R^4O)_{3-b}Si-(R^7)_d-Si(OR^5)_{3-c}R^6{}_c \quad (3)$$

wherein $R^3$ to $R^6$ may be the same or different and each represents a monovalent organic group; b and c may be the same or different and each is a number of 0 to 2; $R^7$ represents an oxygen atom, a phenylene group, or a group represented by $-(CH_2)_n-$, wherein n is an integer of 1 to 6; and d is 0 or 1; and (B) an organic solvent.

The invention further provides a method of film formation which comprises applying the composition for film formation described above to a substrate and then heating the resultant coating.

The invention furthermore provides a silica-based film obtained by the method of film formation described above.

DETAILED DESCRIPTION OF THE INVENTION

The product of hydrolysis and condensation (A) in the invention means a mixture of a hydrolyzate of at least one member selected from the group consisting of the compounds (1) to (3) and a condensate of the hydrolyzate, or means either of the hydrolyzate and the condensate.

In the hydrolyzate in ingredient (A), all the $R^1O-$, $R^2O-$, $R^4O-$, and $R^5O-$groups contained in compounds (1) to (3) to constitute ingredient (A) need not have been hydrolyzed. For example, the hydrolyzate may be one in which only one of those groups has been hydrolyzed or two or more thereof have been hydrolyzed or may be a mixture of these.

The condensate in ingredient (A) means a product formed from the hydrolyzate of compounds (1) to (3) to constitute ingredient (A) by condensing silanol groups of the hydrolyzate to form Si—O—Si bonds. In the invention, however, all the silanol groups need not have undergone condensation. Namely, the term "condensate" as used herein means a concept which includes, for example, a condensate in which a slight proportion of the silanol groups have been condensed and a mixture of condensates which differ in the degree of condensation.

Product of Hydrolysis and Condensation (A)

The product of hydrolysis and condensation (A) is obtained by hydrolyzing and condensing, in the presence of a specific basic compound, at least one silane compound selected from the group consisting of compounds (1) to (3).

Compounds (1):

Examples of the monovalent organic groups represented by R and $R^1$ in formula (1) include alkyl, aryl, allyl, and glycidyl groups. In formula (1), R is preferably a monovalent organic group, more preferably an alkyl or phenyl group.

The alkyl group preferably has 1 to 5 carbon atoms, and examples thereof include methyl, ethyl, propyl, and butyl. These alkyl groups may be linear or branched, and may be ones in which one or more of the hydrogen atoms have been replaced, for example, with fluorine atoms.

In formula (1), examples of the aryl group include phenyl, naphthyl, methylphenyl, ethylphenyl, chlorophenyl, bromophenyl, and fluorophenyl.

Examples of the compounds represented by formula (1) include: trimethoxysilane, triethoxysilane, tri-n-propoxysilane, triisopropoxysilane, tri-n-butoxysilane, tri-sec-butoxysilane, tri-tert-butoxysilane, triphenoxysilane, fluorotrimethoxysilane, fluorotriethoxysilane, fluorotri-n-propoxysilane, fluorotriisopropoxysilane, fluorotri-n-butoxysilane, fluorotri-sec-butoxysilane, fluorotri-tert-butoxysilane, and fluorotriphenoxysilane; methyltrimethoxysilane, methyltriethoxysilane, methyltri-n-propoxysilane, methyltriisopropoxysilane, methyltri-n-butoxysilane, methyltri-sec-butoxysilane, methyltri-tert-butoxysilane, methyltriphenoxysilane, ethyltrimethoxysilane, ethyltriethoxysilane, ethyltri-n-propoxysilane, ethyltriisopropoxysilane, ethyltri-n-butoxysilane, ethyltri-sec-butoxysilane, ethyltri-tert-butoxysilane, ethyltriphenoxysilane, vinyltrimethoxysilane, vinyltriethoxysilane, vinyltri-n-propoxysilane, vinyltriisopropoxysilane, vinyltri-n-butoxysilane, vinyltri-sec-butoxysilane, vinyltri-tert-butoxysilane, vinyltriphenoxysilane, n-propyltrimethoxysilane, n-propyltriethoxysilane, n-propyltri-n-propoxysilane, n-propyltriisopropoxysilane, n-propyltri-n-butoxysilane, n-propyltri-sec-butoxysilane, n-propyltri-tert-butoxysilane, n-propyltriphenoxysilane, isopropyltrimethoxysilane, isopropyltriethoxysilane, isopropyltri-n-propoxysilane, isopropyltriisopropoxysilane, isopropyltri-n-butoxysilane, isopropyltri-sec-butoxysilane, isopropyltri-tert-butoxysilane, isopropyltriphenoxysilane, n-butyltrimethoxysilane, n-butyltriethoxysilane, n-butyltri-n-propoxysilane, n-butyltriisopropoxysilane, n-butyltri-n-butoxysilane, n-butyltri-sec-butoxysilane, n-butyltri-tert-butoxysilane, n-butyltriphenoxysilane, sec-butyltrimethoxysilane, sec-butyltriethoxysilane, sec-butyltri-n-propoxysilane, sec-butyltriisopropoxysilane, sec-butyltri-n-butoxysilane, sec-butyltri-sec-butoxysilane, sec-butyltri-tert-butoxysilane, sec-butyltriphenoxysilane, tert-butyltrimethoxysilane, tert-butyltriethoxysilane, tert-butyltri-n-propoxysilane, tert-butyltriisopropoxysilane, tert-butyltri-n-butoxysilane, tert-butyltri-sec-butoxysilane, tert-butyltri-tert-butoxysilane, tert-butyltriphenoxysilane, phenyltrimethoxysilane, phenyltriethoxysilane, phenyltri-n-propoxysilane, phenyltriisopropoxysilane, phenyltri-n-butoxysilane, phenyltri-sec-butoxysilane, phenyltri-tert-butoxysilane, phenyltriphenoxysilane, vinyltrimethoxysilane, vinyltriethoxysilane, γ-aminopropyltrimethoxysilane, γ-aminopropyltriethoxysilane, γ-glycidoxypropyltrimethoxysilane, γ-glycidoxypropyltriethoxysilane, γ-trifluoropropyltrimethoxysilane, and γ-trifluoropropyltriethoxysilane; and dimethyldimethoxysilane, dimethyldiethoxysilane, dimethyldi-n-propoxysilane, dimethyldiisopropoxysilane, dimethyldi-n-butoxysilane, dimethyldi-sec-butoxysilane, dimethyldi-tert-butoxysilane, dimethyldiphenoxysilane, diethyldimethoxysilane, diethyldiethoxysilane, diethyldi-n-propoxysilane, diethyldiisopropoxysilane, diethyldi-n-butoxysilane, diethyldi-sec-butoxysilane, diethyldi-tert-butoxysilane, diethyldiphenoxysilane, di-n-propyldimethoxysilane, di-n-propyldiethoxysilane, di-n-propyldi-n-propoxysilane, di-n-propyldiisopropoxysilane, di-n-propyldi-n-butoxysilane, di-n-propyldi-sec-butoxysilane, di-n-propyldi-tert-butoxysilane, di-n-propyldiphenoxysilane, diisopropyldimethoxysilane, diisopropyldiethoxysilane, diisopropyldi-n-propoxysilane, diisopropyldiisopropoxysilane, diisopropyldi-n-butoxysilane, diisopropyldi-sec-butoxysilane, diisopropyldi-tert-butoxysilane, diisopropyldiphenoxysilane, di-n-butyldimethoxysilane, di-n-butyldiethoxysilane, di-n-butyldi-n-propoxysilane, di-n-butyldiisopropoxysilane, di-n-butyldi-n-butoxysilane, di-n-butyldi-sec-butoxysilane, di-n-butyldi-tert-butoxysilane, di-n-butyldiphenoxysilane, di-sec-butyldimethoxysilane, di-sec-butyldiethoxysilane, di-sec-butyldi-n-propoxysilane, di-sec-butyldiisopropoxysilane, di-sec-butyldi-n-butoxysilane, di-sec-butyldi-sec-butoxysilane, di-sec-butyldi-tert-butoxysilane, di-sec-butyldiphenoxysilane, di-tert-butyldimethoxysilane, di-tert-butyldiethoxysilane, di-tert-butyldi-n-propoxysilane, di-tert-butyldiisopropoxysilane, di-tert-butyldi-n-butoxysilane, di-tert-butyldi-sec-butoxysilane, di-tert-butyldi-tert-butoxysilane, di-tert-butyldiphenoxysilane, diphenyldimethoxysilane, diphenyldiethoxysilane, diphenyldi-n-propoxysilane, diphenyldiisopropoxysilane, diphenyldi-n-butoxysilane, diphenyldi-sec-butoxysilane, diphenyldi-tert-butoxysilane, diphenyldiphenoxysilane, and divinyltrimethoxysilane.

Preferred examples of the compounds (1) include methyltrimethoxysilane, methyltriethoxysilane, methyltri-n-propoxysilane, methyltriisopropoxysilane, ethyltrimethoxysilane, ethyltriethoxysilane, vinyltrimethoxysilane, vinyltriethoxysilane, phenyltrimethoxysilane, phenyltriethoxysilane, dimethyldimethoxysilane, dimethyldiethoxysilane, diethyldimethoxysilane, diethyldiethoxysilane, diphenyldimethoxysilane, and diphenyldiethoxysilane.

Those compounds may be used alone or in combination of two or more thereof.

Compounds (2):

Examples of the monovalent organic group represented by $R^2$ in formula (2) include the same monovalent organic groups as those enumerated above with regard to formula (1).

Examples of the compounds represented by formula (2) include tetramethoxysilane, tetraethoxysilane, tetra-n-propoxysilane, tetraisopropoxysilane, tetra-n-butoxysilane, tetra-sec-butoxysilane, tetra-tert-butoxysilane, and tetraphenoxysilane.

Compounds (3):

Examples of the monovalent organic groups represented by $R^3$ to $R^6$ in formula (3) include the same monovalent organic groups as those enumerated above with regard to formula (1).

Examples of the compounds represented by formula (3) wherein $R^7$ is an oxygen atom include hexamethoxydisiloxane, hexaethoxydisiloxane, hexaphenoxydisiloxane, 1,1,1,3,3-pentamethoxy-3-methyldisiloxane, 1,1,1,3,3-pentaethoxy-3-methyldisiloxane, 1,1,1,3,3-pentaphenoxy-3-methyldisiloxane, 1,1,1,3,3-pentamethoxy-3-ethyldisiloxane, 1,1,1,3,3-pentaethoxy-3-ethyldisiloxane, 1,1,1,3,3-pentaphenoxy-3-ethyldisiloxane, 1,1,1,3,3-pentamethoxy-3-phenyldisiloxane, 1,1,1,3,3-pentaethoxy-3-phenyldisiloxane, 1,1,1,3,3-pentaphenoxy-3-phenyldisiloxane, 1,1,3,3-tetramethoxy-1,3-dimethyldisiloxane, 1,1,3,3-tetraethoxy-1,3-dimethyldisiloxane, 1,1,3,3-tetraphenoxy-1,3-dimethyldisiloxane, 1,1,3,3-tetramethoxy-1,3-diethyldisiloxane, 1,1,3,3-tetraethoxy-1,3-diethyldisiloxane, 1,1,3,3-tetraphenoxy-1,3-diethyldisiloxane, 1,1,3,3-tetramethoxy-1,3-diphenyldisiloxane, 1,1,3,3-tetraethoxy-1,3-diphenyldisiloxane, 1,1,3,3-tetraphenoxy-1,3-diphenyldisiloxane, 1,1,3-trimethoxy-1,3,3-trimethyldisiloxane, 1,1,3-triethoxy-1,3,3-trimethyldisiloxane, 1,1,3-triphenoxy-1,3,3-trimethyldisiloxane, 1,1,3-trimethoxy-1,3,3-triethyldisiloxane, 1,1,3-triethoxy-1,3,3-triethyldisiloxane, 1,1,3-triphenoxy-1,3,3-triethyldisiloxane, 1,1,3-trimethoxy-1,3,3-triphenyldisiloxane, 1,1,3-triethoxy-1,3,3-triphenyldisiloxane, 1,1,3-triphenoxy-1,3,3-triphenyldisiloxane, 1,3-dimethoxy-1,1,3,3-tetramethyldisiloxane, 1,3-diethoxy-1,1,3,3-tetramethyldisiloxane, 1,3-diphenoxy-1,1,3,3-tetramethyldisiloxane, 1,3-dimethoxy-1,1,3,3-tetraethyldisiloxane, 1,3-diethoxy-1,1,3,3-tetraethyldisiloxane, 1,3-diphenoxy-1,1,3,3-tetraethyldisiloxane, 1,3-dimethoxy-1,1,3,3-tetraphenyldisiloxane, 1,3-diethoxy-1,1,3,3-tetraphenyldisiloxane, and 1,3-diphenoxy-1,1,3,3-tetraphenyldisiloxane.

Preferred of those compounds are hexamethoxydisiloxane, hexaethoxydisiloxane, 1,1,3,3-tetramethoxy-1,3-dimethyldisiloxane, 1,1,3,3-tetraethoxy-1,3-dimethyldisiloxane, 1,1,3,3-tetramethoxy-1,3-diphenyldisiloxane, 1,3-dimethoxy-1,1,3,3-tetramethyldisiloxane, 1,3-diethoxy-1,1,3,3-tetramethyldisiloxane, 1,3-dimethoxy-1,1,3,3-tetraphenyldisiloxane, and 1,3-diethoxy-1,1,3,3-tetraphenyldisiloxane.

Examples of the compounds represented by formula (3) wherein d is 0 include hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentaphenoxy-2-methyldisilane, 1,1,1,2,2-pentamethoxy-2-ethyldisilane, 1,1,1,2,2-pentaethoxy-2-ethyldisilane, 1,1,1,2,2-pentaphenoxy-2-ethyldisilane, 1,1,1,2,2-pentamethoxy-2-phenyldisilane, 1,1,1,2,2-pentaethoxy-2-phenyldisilane, 1,1,1,2,2-pentaphenoxy-2-phenyldisilane, 1,1,2,2-tetramethoxy-1,2-dimethyldisilane, 1,1,2,2-tetraethoxy-1,2-dimethyldisilane, 1,1,2,2-tetraphenoxy-1,2-dimethyldisilane, 1,1,2,2-tetramethoxy-1,2-diethyldisilane, 1,1,2,2-tetraethoxy-1,2-diethyldisilane, 1,1,2,2-tetraphenoxy-1,2-diethyldisilane, 1,1,2,2-tetramethoxy-1,2-diphenyldisilane, 1,1,2,2-tetraethoxy-1,2-diphenyldisilane, 1,1,2,2-tetraphenoxy-1,2-diphenyldisilane, 1,1,2-trimethoxy-1,2,2-trimethyldisilane, 1,1,2-triethoxy-1,2,2-trimethyldisilane, 1,1,2-triphenoxy-1,2,2-trimethyldisilane, 1,1,2-trimethoxy-1,2,2-triethyldisilane, 1,1,2-triethoxy-1,2,2-triethyldisilane, 1,1,2-triphenoxy-1,2,2-triethyldisilane, 1,1,2-trimethoxy-1,2,2-triphenyldisilane, 1,1,2-triethoxy-1,2,2-triphenyldisilane;, 1,1,2-triphenoxy-1,2,2-triphenyldisilane, 1,2-dimethoxy-1,1,2,2-tetramethyldisilane, 1,2-diethoxy-1,1,2,2-tetramethyldisilane, 1,2-diphenoxy-1,1,2,2-tetramethyldisilane, 1,2-dimethoxy-1,1,2,2-tetraethyldisilane, 1,2-diethoxy-1,1,2,2-tetraethyldisilane, 1,2-diphenoxy-1,1,2,2-tetraethyldisilane, 1,2-dimethoxy-1,1,2,2-tetraphenyldisilane, 1,2-diethoxy-1,1,2,2-tetraphenyldisilane, and 1,2-diphenoxy-1,1,2,2-tetraphenyldisilane.

Preferred of those compounds are hexamethoxydisilane, hexaethoxydisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, and 1,2-diethoxy-1,1,2,2-tetraphenyldisilane.

Examples of the compounds represented by formula (3) wherein $R^7$ is a group represented by —$(CH_2)_n$— include bis(trimethoxysilyl)methane, bis(triethoxysilyl)methane, bis(tri-n-propoxysilyl)methane, bis(triisopropoxysilyl)methane, bis(tri-n-butoxysilyl)methane, bis(tri-sec-butoxysilyl)methane, bis(tri-t-butoxysilyl)methane, 1,2-bis(trimethoxysilyl)ethane, 1,2-bis(triethoxysilyl)ethane, 1,2-bis(tri-n-propoxysilyl)ethane, 1,2-bis(triisopropoxysilyl)ethane, 1,2-bis(tri-n-butoxysilyl)ethane, 1,2-bis(tri-sec-butoxysilyl)ethane, 1,2-bis(tri-t-butoxysilyl)ethane, 1-(dimethoxymethylsilyl)-1-(trimethoxysilyl)methane, 1-(diethoxymethylsilyl)-1-(triethoxysilyl)methane, 1-(di-n-propoxymethylsilyl)-1-(tri-n-propoxysilyl)methane, 1-(di-isopropoxymethylsilyl)-1-(triisopropoxysilyl)methane, 1-(di-n-butoxymethylsilyl)-1-(tri-n-butoxysilyl)methane, 1-(di-sec-butoxymethylsilyl)-1-(tri-sec-butoxysilyl)methane, 1-(di-t-butoxymethylsilyl)-1-(tri-t-butoxysilyl)methane, 1-(dimethoxymethylsilyl)-2-(trimethoxysilyl)ethane, 1-(diethoxymethylsilyl)-2-(triethoxysilyl)ethane, 1-(di-n-propoxymethylsilyl)-2-(tri-n-propoxysilyl)ethane, 1-(diisopropoxymethylsilyl)-2-(triisopropoxysilyl)ethane, 1-(di-n-butoxymethylsilyl)-2-(tri-n-butoxysilyl)ethane, 1-(di-sec-butoxymethylsilyl)-2-(tri-sec-butoxysilyl)ethane, 1-(di-t-butoxymethylsilyl)-2-(tri-t-butoxysilyl)ethane, bis(dimethoxymethylsilyl)methane, bis(diethoxymethylsilyl)methane, bis(di-n-propoxymethylsilyl)methane, bis(diisopropoxymethylsilyl)methane, bis(di-n-butoxymethylsilyl)methane, bis(di-sec-butoxymethylsilyl)methane, bis(di-t-butoxymethylsilyl)methane, 1,2-bis(dimethoxymethylsilyl)ethane, 1,2-bis(diethoxymethylsilyl)ethane, 1,2-bis(di-n-propoxymethylsilyl)ethane, 1,2-bis(diisopropoxymethylsilyl)ethane, 1,2-bis(di-n-butoxymethylsilyl)ethane, 1,2-bis(di-sec-butoxymethylsilyl)ethane, 1,2-bis(di-t-butoxymethylsilyl)ethane, 1,2-bis(trimethoxysilyl)benzene, 1,2-bis(triethoxysilyl)benzene, 1,2-bis(tri-n-propoxysilyl)benzene, 1,2-bis(triisopropoxysilyl)benzene, 1,2-bis(tri-n-butoxysilyl)benzene, 1,2-bis(tri-sec-butoxysilyl)benzene, 1,2-bis(tri-t-butoxysilyl)benzene, 1,3-bis(trimethoxysilyl)benzene, 1,3-bis(triethoxysilyl)benzene, 1,3-bis(tri-n-propoxysilyl)benzene, 1,3-bis(triisopropoxysilyl)benzene, 1,3-bis(tri-n-butoxysilyl)benzene, 1,3-bis(tri-sec-butoxysilyl)benzene, 1,3-bis(tri-t-butoxysilyl)benzene, 1,4-bis(trimethoxysilyl)benzene, 1,4-bis(triethoxysilyl)benzene, 1,4-bis(tri-n-propoxysilyl)benzene, 1,4-bis(triisopropoxysilyl)benzene, 1,4-bis(tri-n-butoxysilyl)benzene, 1,4-bis(tri-sec-butoxysilyl)benzene, and 1,4-bis(tri-t-butoxysilyl)benzene.

Preferred of those compounds are bis(trimethoxysilyl)methane, bis(triethoxysilyl)methane, 1,2-bis(trimethoxysilyl)ethane, 1,2-bis(triethoxysilyl)ethane, 1-(dimethoxymethylsilyl)-1-(trimethoxysilyl)methane, 1-(diethoxymethylsilyl)-1-(triethoxysilyl)methane, 1-(dimethoxymethylsilyl)-2-(trimethoxysilyl)ethane, 1-(diethoxymethylsilyl)-2-(triethoxysilyl)ethane, bis(dimethoxymethylsilyl)methane, bis(diethoxymethylsilyl)methane, 1,2-bis(dimethoxymethylsilyl)ethane, 1,2-bis(diethoxymethylsilyl)ethane, 1,2-bis(trimethoxysilyl)benzene, 1,2-bis(triethoxysilyl)benzene, 1,3-bis (trimethoxysilyl)benzene, 1,3-bis(triethoxysilyl)benzene, 1,4-bis(trimethoxysilyl)benzene, and 1,4-bis(triethoxysilyl)benzene.

In the invention, the compounds (1), (2), and (3) described above may be used alone or in combination of two or more thereof to constitute ingredient (A).

When at least one silane compound selected from the group consisting of the compounds (1) to (3) is hydrolyzed and condensed, water is used in an amount of preferably from more than 20 mol to 150 mol, more preferably from more than 20 mol to 130 mol, per mol of the at least one compound selected from the compounds (1) to (3). If water is added in an amount of 20 mol or smaller, there are cases where the resultant composition gives a coating film having poor cracking resistance. On the other hand, if the amount of water added is larger than 150 mol, there are cases where polymer precipitation or gelation occurs during the hydrolysis and condensation reactions.

The addition of at least one silane compound selected from the group consisting of the compounds (1) to (3) to the reaction mixture may be conducted en bloc, or may be conducted continuously or intermittently. In the case where at least one silane compound selected from the group consisting of the compounds (1) to (3) is added continuously or intermittently, the period of addition is preferably from 5 minutes to 12 hours.

The production of the product of hydrolysis and condensation (A) for use in the invention is characterized in that a specific basic compound is used in hydrolyzing and condensing at least one silane compound selected from the group consisting of the compounds (1) to (3).

By using an ammonium compound, a silica-based film having a low dielectric constant, a high modulus of elasticity, and excellent adhesion to substrates can be obtained.

The ammonium compound that can be used in the invention is a salt formed using (a) a nitrogen-containing compound and (b) at least one member selected from the group consisting of anionic group-containing compounds and halogen compounds.

In the invention, examples of the anionic group include hydroxyl, nitric acid, carbonate, carboxyl, sulfonyl, phosphonyl, carbonyl and phenoxy.

Examples of the ammonium compound of the invention include the compounds represented by the following formulae (5) and (6):

$$(R^{10}R^{11}R^{12}R^{13}N)_fR^{14} \quad (5)$$

$$R^{15}(R^{16})_h \quad (6),$$

wherein $R^{10}$ to $R^{13}$ may be the same or different and each represents a hydrogen atom, an alkyl group having 1 to 10 carbon atoms, a hydroxyalkyl group, an aryl group or an arylalkyl group; $R^{14}$ represents a halogen atom or an anionic group having a valency of 1 to 4; f is an integer of 1 to 4; $R^{15}$ represents a nitrogen-containing cyclic cationic group having a valency of g; $R^{16}$ represents a halogen atom or an anionic group having a valency of i; i is an integer of 1 to 4; g is an integer of 1 to i, for i>1, and g=i, for i=1; and i·h≦g (or h less than or equal to g/i).

Examples of the alkyl group having 1 to 10 carbon atoms include methyl, ethyl, propyl, butyl, hexyl, etc. Examples of the aryl group include phenyl, tolyl, and etc. Examples of the arylalkyl group include benzyl, etc. Examples of the halogen atoms include a chlorine atom, bromine atom, etc.

The anionic group having a valency of 1 to 4 is derived from a compound having 1 to 4 anionic group(s), and the nitrogen-containing cyclic cationic group having a valency of g is derived from an aromatic compound having g nitrogen atoms, a heterocyclic compound having g nitrogen atoms or an alicyclic compound having g nitrogen atoms.

Examples of the compounds represented by the formula (5) include ammonium hydroxide, ammonium chloride, ammonium bromide, ammonium iodide, ammonium fluoride, ammonium nitrate, ammonium sulfate, ammonium hydrogensulfate, ammonium phosphate, ammonium carbonate, ammonium phenolate, ammonium acetate, ammonium adipate, ammonium alginate, ammonium benzoate, ammonium citrate, ammonium formate, ammonium hydrogencarbonate, ammonium phthalate, ammonium salicylate, ammonium succinate, ammonium maleate, ammonium propionate, ammonium butanate, ammonium pentanoate, ammonium hexanoate, ammonium heptanoate, ammonium octanoate, ammonium nonanoate, ammonium decanoate, ammonium oxalate, ammonium methylmalonate, ammonium sebacate, ammonium gallate, ammonium butyrate, ammonium mellitate, ammonium arachidonate, ammonium shikimate, ammonium 2-ethylhexanoate, ammonium oleate, ammonium stearate, ammonium linoleate, ammonium linolenate, ammonium p-aminobenzoate, ammonium p-toluenesulfonate, ammonium benzenesulfonate, ammonium monochloroacetate, ammonium dichloroacetate, ammonium trichloroacetate, ammonium trifluoroacetate, ammonium malonate, ammonium sulfonate, ammonium fumarate, ammonium tartrate, ammonium itaconate, ammonium mesaconate, ammonium citraconate, ammonium malate, ammonium glutarate;

methylammonium hydroxide, methylammonium chloride, methylammonium bromide, methylammonium iodide, methylammonium fluoride, methylammonium nitrate, methylammonium sulfate, methylammonium hydrogensulfate, methylammonium phosphate, methylammonium carbonate, methylammonium phenolate, methylammonium acetate, methylammonium adipate, methylammonium alginate, methylammonium benzoate, methylammonium citrate, methylammonium formate, methylammonium hydrogencarbonate, methylammonium phthalate, methylammonium salicylate, methylammonium succinate, methylammonium maleate, methylammonium propionate, methylammonium butanate, methylammonium pentanoate, methylammonium hexanoate, methylammonium heptanoate, methylammonium octanoate, methylammonium nonanoate, methylammonium decanoate, methylammonium oxalate, methylammonium methylmalonate, methylammonium sebacate, methylammonium gallate, methylammonium butyrate, methylammonium mellitate, methylammonium arachidonate, methylammonium shikimate, methylammonium 2-ethylhexanoate, methylammonium oleate, methylammonium stearate, methylammonium linoleate, methylammonium linolenate, methylammonium p-aminobenzoate, methylammonium p-toluenesulfonate, methylammonium benzenesulfonate, methylammonium monochloroacetate, methylammonium dichloroacetate, methylammonium trichloroacetate, methylammonium trifluoroacetate, methylammonium malonate, methylammonium sulfonate, methylammonium fumarate, methylammonium tartrate, methylammonium itaconate, methylammonium mesaconate, methylammonium citraconate, methylammonium malate, methylammonium glutarate;

dimethylammonium hydroxide, dimethylammonium chloride, dimethylammonium bromide, dimethylammonium iodide, dimethylammonium fluoride, dimethylammonium nitrate, dimethylammonium sulfate, dimethylammonium hydrogensulfate, dimethylammonium phosphate, dimethylammonium carbonate, dimethylammonium phenolate, dimethylammonium acetate, dimethylammonium adipate, dimethylammonium alginate, dimethylammonium benzoate, dimethylammonium citrate, dimethylammonium formate, dimethylammonium hydrogencarbonate, dimethylammonium phthalate, dimethylammonium salicylate, dimethylammonium succinate, dimethylammonium maleate, dimethylammonium propionate, dimethylammonium butanate, dimethylammonium pentanoate, dimethylammonium hexanoate, dimethylammonium heptanoate, dimethylammonium octanoate, dimethylammonium nonanoate, dimethylammonium decanoate, dimethylammonium oxalate, dimethylammonium methylmalonate, dimethylammonium sebacate, dimethylammonium gallate, dimethylammonium butyrate, dimethylammonium mellitate, dimethylammonium arachidonate, dimethylammonium shikimate, dimethylammonium 2-ethylhexanoate, dimethylammonium oleate, dimethylammonium stearate, dimethylammonium linoleate, dimethylammonium linolenate, dimethylammonium p-aminobenzoate, dimethylammonium p-toluenesulfonate, dimethylammonium benzenesulfonate, dimethylammonium monochloroacetate, dimethylammonium dichloroacetate, dimethylammonium trichloroacetate, dimethylammonium trifluoroacetate, dimethylammonium malonate, dimethylammonium sulfonate, dimethylammonium fumarate, dimethylammonium tartrate, dimethylammonium itaconate, dimethylammonium mesaconate, dimethylammonium citraconate, dimethylammonium malate, dimethylammonium glutarate;

trimethylammonium hydroxide, trimethylammonium chloride, trimethylammonium bromide, trimethylammonium iodide, trimethylammonium fluoride, trimethylammonium nitrate, trimethylammonium sulfate, trimethylammonium hydrogensulfate, trimethylammonium phosphate, trimethylammonium carbonate, tirmethylammonium phenolate, trimethylammonium acetate, trimethylammonium adipate, trimethylammonium alginate, trimethylammonium benzoate, trimethylammonium citrate, trimethylammonium formate, trimethylammonium hydrogencarbonate, trimethylammonium phthalate, trimethylammonium salicylate, trimethylammonium succinate, trimethylammonium maleate, trimethylammonium propionate, trimethylammonium butanate, trimethylammonium pentanoate, trimethylammonium hexanoate, trimethylammonium heptanoate, trimethylammonium octanoate, trimethylammonium nonanoate, trimethylammonium decanoate, trimethylammonium oxalate, trimethylammonium methylmalonate, trimethylammonium sebacate, trimethylammonium gallate, trimethylammonium butyrate, trimethylammonium mellitate, trimethylammonium arachidonate, trimethylammonium shikimate, trimethylammonium 2-ethylhexanoate, trimethylammonium oleate, trimethylammonium stearate, trimethylammonium linoleate, trimethylammonium linolenate, trimethylammonium p-aminobenzoate, trimethylammonium p-toluenesulfonate, trimethylammonium benzenesulfonate, trimethylammonium monochloroacetate, trimethylammonium dichloroacetate, trimethylammonium trichloroacetate, trimethylammonium trifluoroacetate, trimethylammonium malonate, trimethylammonium sulfonate, trimethylammonium fumarate, trimethylammonium tartrate, trimethylammonium itaconate, trimethylammonium mesaconate, trimethylammonium citraconate, trimethylammonium malate, trimethylammonium glutarate;

ethylammonium hydroxide, ethylammonium chloride, ethylammonium bromide, ethylammonium iodide, ethylammonium fluoride, ethylammonium nitrate, ethylammonium sulfate, ethylammonium hydrogensulfate, ethylammonium phosphate, ethylammonium carbonate, ethylammonium phenolate, ethylammonium acetate, ethylammonium adipate, ethylammonium alginate, ethylammonium benzoate, ethylammonium citrate, ethylammonium formate, ethylammonium hydrogencarbonate, ethylammonium phthalate, ethylammonium salicylate, ethylammonium succinate, ethylammonium maleate, ethylammonium propionate, ethylammonium butanate, ethylammonium pentanoate, ethylammonium hexanoate, ethylammonium heptanoate, ethylammonium octanoate, ethylammonium nonanoate, ethylammonium decanoate, ethylammonium oxalate, ethylammonium methylmalonate, ethylammonium sebacate, ethylammonium gallate, ethylammonium butyrate, ethylammonium mellitate, ethylammonium arachidonate, ethylammonium shikimate, ethylammonium 2-ethylhexanoate, ethylammonium oleate, ethylammonium stearate, ethylammonium linoleate, ethylammonium linolenate, ethylammonium p-aminobenzoate, ethylammonium p-toluenesulfonate, ethylammonium benzenesulfonate, ethylammonium monochloroacetate, ethylammonium dichloroacetate, ethylammonium trichloroacetate, ethylammonium trifluoroacetate, ethylammonium malonate, ethylammonium sulfonate, ethylammonium fumarate, ethylammonium tartrate, ethylammonium itaconate, ethylammonium mesaconate, ethylammonium citraconate, ethylammonium malate, ethylammonium glutarate;

diethylammonium hydroxide, diethylammonium chloride, diethylammonium bromide, diethylammonium iodide, diethylammonium fluoride, diethylammonium nitrate, diethylammonium sulfate, diethylammonium hydrogensulfate, diethylammonium phosphate, diethylammonium carbonate, diethylammonium phenolate, diethylammonium acetate, diethylammonium adipate, diethylammonium alginate, diethylammonium benzoate, diethylammonium citrate, diethylammonium formate, diethylammonium hydrogencarbonate, diethylammonium phthalate, diethylammonium salicylate, diethylammonium succinate, diethylammonium maleate, diethylammonium propionate, diethylammonium butanate, diethylammonium pentanoate, diethylammonium hexanoate, diethylammonium heptanoate, diethylammonium octanoate, diethylammonium nonanoate, diethylammonium decanoate, diethylammonium oxalate, diethylammonium methylmalonate, diethylammonium sebacate, diethylammonium gallate, diethylammonium butyrate, diethylammonium mellitate, diethylammonium arachidonate, diethylammonium shikimate, diethylammonium 2-ethylhexanoate, diethylammonium oleate, diethylammonium stearate, diethylammonium linoleate, diethylammonium linolenate, diethylammonium p-aminobenzoate, diethylammonium p-toluenesulfonate, diethylammonium benzenesulfonate, diethylammonium monochloroacetate, diethylammonium dichloroacetate, diethylammonium trichloroacetate, diethylammonium trifluoroacetate, diethylammonium malonate, diethylammonium sulfonate, diethylammonium fumarate, diethylammonium tartrate, diethylammonium itaconate, diethylammonium mesaconate, diethylammonium citraconate, diethylammonium malate, diethylammonium glutarate;

triethylammonium hydroxide, triethylammonium chloride, triethylammonium bromide, triethylammonium iodide, triethylammonium fluoride, triethylammonium nitrate, triethylammonium sulfate, triethylammonium hydrogensulfate, triethylammonium phosphate, triethylammonium carbonate, triethylammonium phenolate, triethylammonium acetate, triethylammonium adipate, triethylammonium alginate, triethylammonium benzoate, triethylammonium citrate, triethylammonium formate, triethylammonium hydrogencarbonate, triethylammonium phthalate, triethylammonium salicylate, triethylammonium succinate, triethylammonium maleate, triethylammonium propionate, triethylammonium butanate, triethylammonium pentanoate, triethylammonium hexanoate, triethylammonium heptanoate, triethylammonium octanoate, triethylammonium nonanoate, triethylammonium decanoate, triethylammonium oxalate, triethylammonium methylmalonate, triethylammonium sebacate, triethylammonium gallate, triethylammonium butyrate, triethylammonium mellitate, triethylammonium arachidonate, triethylammonium shikimate, triethylammonium 2-ethylhexanoate, triethylammonium oleate, triethylammonium stearate, triethylammonium linoleate, triethylammonium linolenate, triethylammonium p-aminobenzoate, triethylammonium p-toluenesulfonate, triethylammonium benzenesulfonate, triethylammonium monochloroacetate, triethylammonium dichloroacetate, triethylammonium trichloroacetate, triethylammonium trifluoroacetate, triethylammonium malonate, triethylammonium sulfonate, triethylammonium fumarate, triethylammonium tartrate, triethylammonium itaconate, triethylammonium mesaconate, triethylammonium citraconate, triethylammonium malate, triethylammonium glutarate;

tripropylammonium hydroxide, tripropylammonium chloride, tripropylammonium bromide, tripropylammonium iodide, tripropylammonium fluoride, tripropylammonium nitrate, tripropylammonium sulfate, tripropylammonium hydrogensulfate, tripropylammonium phosphate, tripropylammonium carbonate, tripropylammonium phenolate, tripropylammonium acetate, tripropylammonium adipate, tripropylammonium alginate, tripropylammonium benzoate, tripropylammonium citrate, tripropylammonium formate, tripropylammonium hydrogencarbonate, tripropylammonium phthalate, tripropylammonium salicylate, tripropylammonium succinate, tripropylammonium maleate, tripropylammonium propionate, tripropylammonium butanate, tripropylammonium pentanoate, tripropylammonium hexanoate, tripropylammonium heptanoate, tripropylammonium octanoate, tripropylammonium nonanoate, tripropylammonium decanoate, tripropylammonium oxalate, tripropylammonium methylmalonate, tripropylammonium sebacate, tripropylammonium gallate, tripropylammonium butyrate, tripropylammonium mellitate, tripropylammonium arachidonate, tripropylammonium shikimate, tripropylammonium 2-ethylhexanoate, tripropylammonium oleate, tripropylammonium stearate, tripropylammonium linoleate, tripropylammonium linolenate, tripropylammonium p-aminobenzoate, tripropylammonium p-toluenesulfonate, tripropylammonium benzenesulfonate, tripropylammonium monochloroacetate, tripropylammonium dichloroacetate, tripropylammonium trichloroacetate, tripropylammonium trifluoroacetate, tripropylammonium malonate, tripropylammonium sulfonate, tripropylammonium fumarate, tripropylammonium tartrate, tripropylammonium itaconate, tripropylammonium mesaconate, tripropylammonium citraconate, tripropylammonium malate, tripropylammonium glutarate;

tributylammonium hydroxide, tributylammonium chloride, tributylammonium bromide, tributylammonium iodide, tributylammonium fluoride, tributylammonium nitrate, tributylammonium sulfate, tributylammonium hydrogensulfate, tributylammonium phosphate, tributylammonium carbonate, tributylammonium phenolate, tributylammonium acetate, tributylammonium adipate, tributylammonium alginate, tributylammonium benzoate, tributylammonium citrate, tributylammonium formate, tributylammonium hydrogencarbonate, tributylammonium phthalate, tributylammonium salicylate, tributylammonium succinate, tributylammonium maleate, tributylammonium propionate, tributylammonium butanate, tributylammonium pentanoate, tributylammonium hexanoate, tributylammonium heptanoate, tributylammonium octanoate, tributylammonium nonanoate, tributylammonium decanoate, tributylammonium oxalate, tributylammonium methylmalonate, tributylammonium sebacate, tributylammonium gallate, tributylammonium butyrate, tributylammonium mellitate, tributylammonium arachidonate, tributylammonium shikimate, tributylammonium 2-ethylhexanoate, tributylammonium oleate, tributylammonium stearate, tributylammonium linoleate, tributylammonium linolenate, tributylammonium p-aminobenzoate, tributylammonium p-toluenesulfonate, tributylammonium benzenesulfonate, tributylammonium monochloroacetate, tributylammonium dichloroacetate, tributylammonium trichloroacetate, tributylammonium trifluoroacetate, tributylammonium malonate, tributylammonium sulfonate, tributylammonium fumarate, tributylammonium tartrate, tributylammonium itaconate, tributylammonium mesaconate, tributylammonium citraconate, tributylammonium malate, tributylammonium glutarate;

tetramethylammonium hydroxide, tetramethylammonium chloride, tetramethylammonium bromide, tetramethylammonium iodide, tetramethylammonium fluoride, tetramethylammonium nitrate, tetramethylammonium sulfate, tetramethylammonium hydrogensulfate, tetramethylammonium phosphate, tetramethylammonium carbonate, tetramthylammonium phenolate, tetramethylammonium acetate, tetramethylammonium adipate, tetramethylammonium alginate, tetramethylammonium benzoate, tetramethylammonium citrate, tetramethylammonium formate, tetramethylammonium hydrogencarbonate, tetramethylammonium phthalate, tetramethylammonium salicylate, tetramethylammonium succinate, tetramethylammonium maleate, tetramethylammonium propionate, tetramethylammonium butanate, tetramethylammonium pentanoate, tetramethylammonium hexanoate, tetramethylammonium heptanoate, tetramethylammonium octanoate, tetramethylammonium nonanoate, tetramethylammonium decanoate, tetramethylammonium oxalate, tetramethylammonium methylmalonate, tetramethylammonium sebacate, tetramethylammonium gallate, tetramethylammonium butyrate, tetramethylammonium mellitate, tetramethylammonium arachidonate, tetramethylammonium shikimate, tetramethylammonium 2-ethylhexanoate, tetramethylammonium oleate, tetramethylammonium stearate, tetramethylammonium linoleate, tetramethylammonium linolenate, tetramethylammonium p-aminobenzoate, tetramethylammonium p-toluenesulfonate, tetramethylammonium benzenesulfonate, tetramethylammonium monochloroacetate, tetramethylammonium dichloroacetate, tetramethylammonium trichloroacetate, tetramethylammonium trifluoroacetate, tetramethylammonium malonate, tetramethylammonium sulfonate, tetramethylammonium fumarate, tetramethylammonium tartrate, tetramethylammonium itaconate, tetramethylammonium mesaconate, tetramethylammonium citraconate, tetramethylammonium malate, tetramethylammonium glutarate;

tetraethylammonium hydroxide, tetraethylammonium chloride, tetraethylammonium bromide, tetraethylammonium iodide, tetraethylammonium fluoride, tetraethylammonium nitrate, tetraethylammonium sulfate, tetraethylammonium hydrogensulfate, tetraethylammonium phosphate, tetraethylammonium carbonate, tetraethylammonium phenolate, tetraethylammonium acetate, tetraethylammonium adipate, tetraethylammonium alginate, tetraethylammonium benzoate, tetraethylammonium citrate, tetraethylammonium formate, tetraethylammonium hydrogencarbonate, tetraethylammonium phthalate, tetraethylammonium salicylate, tetraethylammonium succinate, tetraethylammonium maleate, tetraethylammonium propionate, tetraethylammonium butanate, tetraethylammonium pentanoate, tetraethylammonium hexanoate, tetraethylammonium heptanoate, tetraethylammonium octanoate, tetraethylammonium nonanoate, tetraethylammonium decanoate, tetraethylammonium oxalate, tetraethylammonium methylmalonate, tetraethylammonium sebacate, tetraethylammonium gallate, tetraethylammonium butyrate, tetraethylammonium mellitate, tetraethylammonium arachidonate, tetraethylammonium shikimate, tetraethylammonium 2-ethylhexanoate, tetraethylammonium oleate, tetraethylammonium stearate, tetraethylammonium linoleate, tetraethylammonium linolenate, tetraethylammonium p-aminobenzoate, tetraethylammonium p-toluenesulfonate, tetraethylammonium benzenesulfonate, tetraethylammonium monochloroacetate, tetraethylammonium dichloroacetate, tetraethylammonium trichloroacetate, tetraethylammonium trifluoroacetate, tetraethylammonium malonate, tetraethylammonium sulfonate, tetraethylammonium fumarate, tetraethylammonium tartrate, tetraethylammonium itaconate, tetraethylammonium mesaconate, tetraethylammonium citraconate, tetraethylammonium malate, tetraethylammonium glutarate;

tetrapropylammonium hydroxide, tetrapropylammonium chloride, tetrapropylammonium bromide, tetrapropylammonium iodide, tetrapropylammonium fluoride, tetrapropylammonium nitrate, tetrapropylammonium sulfate, tetrapropylammonium hydrogensulfate, tetrapropylammonium phosphate, tetrapropylammonium carbonate, tetrapropylammonium phenolate, tetrapropylammonium acetate, tetrapropylammonium adipate, tetrapropylammonium alginate, tetrapropylammonium benzoate, tetrapropylammonium citrate, tetrapropylammonium formate, tetrapropylammonium hydrogencarbonate, tetrapropylammonium phthalate, tetrapropylammonium salicylate, tetrapropylammonium succinate, tetrapropylammonium maleate, tetrapropylammonium propionate, tetrapropylammonium butanate, tetrapropylammonium pentanoate, tetrapropylammonium hexanoate, tetrapropylammonium heptanoate, tetrapropylammonium octanoate, tetrapropylammonium nonanoate, tetrapropylammonium decanoate, tetrapropylammonium oxalate, tetrapropylammonium methylmalonate, tetrapropylammonium sebacate, tetrapropylammonium gallate, tetrapropylammonium butyrate, tetrapropylammonium mellitate, tetrapropylammonium arachidonate, tetrapropylammonium shikimate, tetrapropylammonium 2-ethylhexanoate, tetrapropylammonium oleate; tetrapropylammonium stearate, tetrapropylammonium linoleate, tetrapropylammonium linolenate, tetrapropylammonium p-aminobenzoate, tetrapropylammonium p-toluenesulfonate, tetrapropylammonium benzenesulfonate, tetrapropylammonium monochloroacetate, tetrapropylammonium dichloroacetate, tetrapropylammonium trichloroacetate, tetrapropylammonium trifluoroacetate, tetrapropylammonium malonate, tetrapropylammonium sulfonate, tetrapropylammonium fumarate, tetrapropylammonium tartrate, tetrapropylammonium itaconate, tetrapropylammonium mesaconate, tetrapropylammonium citraconate, tetrapropylammonium malate, tetrapropylammonium glutarate;

tetrabutylammonium hydroxide, tetrabutylammonium chloride, tetrabutylammonium bromide, tetrabutylammonium iodide, tetrabutylammonium fluoride, tetrabutylammonium nitrate, tetrabutylammonium sulfate, tetrabutylammonium hydrogensulfate, tetrabutylammonium phosphate, tetrabutylammonium carbonate, tetrabutylammonium phenolate, tetrabutylammonium acetate, tetrabutylammonium adipate, tetrabutylammonium alginate, tetrabutylammonium benzoate, tetrabutylammonium citrate, tetrabutylammonium formate, tetrabutylammonium hydrogencarbonate, tetrabutylammonium phthalate, tetrabutylammonium salicylate, tetrabutylammonium succinate, tetrabutylammonium maleate, tetrabutylammonium propionate, tetrabutylammonium butanate, tetrabutylammonium pentanoate, tetrabutylammonium hexanoate, tetrabutylammonium heptanoate, tetrabutylammonium octanoate, tetrabutylammonium nonanoate, tetrabutylammonium decanoate, tetrabutylammonium oxalate, tetrabutylammonium methylmalonate, tetrabutylammonium sebacate, tetrabutylammonium gallate, tetrabutylammonium butyrate, tetrabutylammonium mellitate, tetrabutylammonium arachidonate, tetrabutylammonium shikimate, tetrabutylammonium 2-ethylhexanoate, tetrabutylammonium oleate, tetrabutylammonium stearate, tetrabutylammonium linoleate, tetrabutylammonium linolenate, tetrabutylammonium p-aminobenzoate, tetrabutylammonium p-toluenesulfonate, tetrabutylammonium benzenesulfonate, tetrabutylammonium monochloroacetate, tetrabutylammonium dichloroacetate, tetrabutylammonium trichloroacetate, tetrabutylammonium trifluoroacetate, tetrabutylammonium malonate, tetrabutylammonium sulfonate, tetrabutylammonium fumarate, tetrabutylammonium tartrate, tetrabutylammonium itaconate, tetrabutylammonium mesaconate, tetrabutylammonium citraconate, tetrabutylammonium malate, tetrabutylammonium glutarate; trimethylbenzylammonium hydroxide, trimethylbenzylammonium chloride, trimethylbenzylammonium bromide, trimethylbenzylammonium iodide, trimethylbenzylammonium fluoride, trimethylbenzylammonium nitrate, trimethylbenzylammonium sulfate, trimethylbenzylammonium hydrogensulfate, trimethylbenzylammonium phosphate, trimethylbenzylammonium carbonate, trimethylbenzylammonium phenolate, trimethylbenzylammonium acetate, trimethylbenzylammonium adipate, trimethylbenzylammonium alginate, trimethylbenzylammonium benzoate, trimethylbenzylammonium citrate, trimethylbenzylammonium formate, trimethylbenzylammonium hydrogencarbonate, trimethylbenzylammonium phthalate, trimethylbenzylammonium salicylate, trimethylbenzylammonium succinate, trimethylbenzylammonium maleate, trimethylbenzylammonium propionate, trimethylbenzylammonium butanate, trimethylbenzylammonium pentanoate, trimethylbenzylammonium hexanoate, trimethylbenzylammonium heptanoate, trimethylbenzylammonium octanoate, trimethylbenzylammonium nonanoate, trimethylbenzylammonium decanoate, trimethylbenzylammonium oxalate, trimethylbenzylammonium methylmalonate, trimethylbenzylammonium sebacate, trimethylbenzylammonium gallate, trimethylbenzylammonium butyrate, trimethylbenzylammonium mellitate, trimethylbenzylammonium arachidonate, trimethylbenzylammonium shikimate, trimethylbenzylammonium, 2-ethylhexanoate, trimethylbenzylammonium oleate, trimethylbenzylammonium stearate, trimethylbenzylammonium linoleate, trimethylbenzylammonium linolenate, trimethylbenzylammonium p-aminobenzoate, trimethylbenzylammonium p-toluenesulfonate, trimethylbenzylammonium benzenesulfonate, trimethylbenzylammonium monochloroacetate, trimethylbenzylammonium dichloroacetate, trimethylbenzylammonium trichloroacetate, trimethylbenzylammonium trifluoroacetate, trimethylbenzylammonium malonate, trimethylbenzylammonium sulfonate, trimethylbenzylammonium fumarate, trimethylbenzylammonium tartrate, trimethylbenzylammonium itaconate, trimethylbenzylammonium mesaconate, trimethylbenzylammonium citraconate, trimethylbenzylammonium malate, trimethylbenzylammonium glutarate;

ethanolammonium hydroxide, ethanolammonium chloride, ethanolammonium bromide, ethanolammonium iodide, ethanolammonium fluoride, ethanolammonium nitrate, ethanolammonium sulfate, ethanolammonium hydrogensulfate, ethanolammonium phosphate, ethanolammonium carbonate, ethanolammonium phenolate, ethanolammonium acetate, ethanolammonium adipate, ethanolammonium alginate, ethanolammonium benzoate, ethanolammonium citrate, ethanolammonium formate, ethanolammonium hydrogencarbonate, ethanolammonium phthalate, ethanolammonium salicylate, ethanolammonium succinate, ethanolammonium maleate, ethanolammonium propionate, ethanolammonium butanate, ethanolammonium pentanoate, ethanolammonium hexanoate, ethanolammonium heptanoate, ethanolammonium octanoate, ethanolammonium nonanoate, ethanolammonium decanoate, ethanolammonium oxalate, ethanolammonium methylmalonate, ethanolammonium sebacate, ethanolammonium gallate, ethanolammonium butyrate, ethanolammonium mellitate, ethanolammonium arachidonate, ethanolammonium shikimate, ethanolammonium 2-ethylhexanoate, ethanolammonium oleate, ethanolammonium stearate, ethanolammonium linoleate, ethanolammonium linolenate, ethanolammonium p-aminobenzoate, ethanolammonium p-toluenesulfonate, ethanolammonium benzenesulfonate, ethanolammonium monochloroacetate, ethanolammonium dichloroacetate, ethanolammonium trichloroacetate, ethanolammonium trifluoroacetate, ethanolammonium malonate, ethanolammonium sulfonate, ethanolammonium fumarate, ethanolammonium tartrate, ethanolammonium itaconate, ethanolammonium mesaconate, ethanolammonium citraconate, ethanolammonium malate, ethanolammonium glutarate;

diethanolammonium hydroxide, diethanolammonium chloride, diethanolammonium bromide, diethanolammonium iodide, diethanolammonium fluoride, diethanolammonium nitrate, diethanolammonium sulfate, diethanolammonium hydrogensulfate, diethanolammonium phosphate, diethanolammonium carbonate, diethanolammonium phenolate, diethanolammonium acetate, diethanolammonium adipate, diethanolammonium alginate, diethanolammonium benzoate, diethanolammonium citrate, diethanolammonium formate, diethanolammonium hydrogencarbonate, diethanolammonium phthalate, diethanolammonium salicylate, diethanolammonium succinate, diethanolammonium maleate, diethanolammonium propionate, diethanolammonium butanate, diethanolammonium pentanoate, diethanolammonium hexanoate, diethanolammonium heptanoate, diethanolammonium octanoate, diethanolammonium nonanoate, diethanolammonium decanoate, diethanolammonium oxalate, diethanolammonium methylmalonate, diethanolammonium sebacate, diethanolammonium gallate, diethanolammonium butyrate, diethanolammonium mellitate, diethanolammonium arachidonate, diethanolammonium shikimate, diethanolammonium 2-ethylhexanoate, diethanolammonium oleate, diethanolammonium stearate, diethanolammonium linoleate, diethanolammonium linolenate, diethanolammonium p-aminobenzoate, diethanolammonium p-toluenesulfonate, diethanolammonium benzenesulfonate, diethanolammonium monochloroacetate, diethanolammonium dichloroacetate, diethanolammonium trichloroacetate, diethanolammonium trifluoroacetate, diethanolammonium malonate, diethanolammonium sulfonate, diethanolammonium fumarate, diethanolammonium tartrate, diethanolammonium itaconate, diethanolammonium mesaconate, diethanolammonium citraconate, diethanolammonium malate, diethanolammonium glutarate; and triethanolammonium hydroxide, triethanolammonium chloride, triethanolammonium bromide, triethanolammonium iodide, triethanolammonium fluoride, triethanolammonium nitrate, triethanolammonium sulfate, triethanolammonium hydrogensulfate, triethanolammonium phosphate, triethanolammonium carbonate, triethanolammonium phenolate, triethanolammonium acetate, triethanolammonium adipate, triethanolammonium alginate, triethanolammonium benzoate, triethanolammonium citrate, triethanolammonium formate, triethanolammonium hydrogencarbonate, triethanolammonium phthalate, triethanolammonium salicylate, triethanolammonium succinate, triethanolammonium maleate, triethanolammonium propionate, triethanolammonium butanate, triethanolammonium pentanoate, triethanolammonium hexanoate, triethanolammonium heptanoate, triethanolammonium octanoate, triethanolammonium nonanoate, triethanolammonium decanoate, triethanolammonium oxalate, triethanolammonium methylmalonate, triethanolammonium sebacate, triethanolammonium gallate, triethanolammonium butyrate, triethanolammonium mellitate, triethanolammonium arachidonate, triethanolammonium shikimate, triethanolammonium 2-ethylhexanoate, triethanolammonium oleate, triethanolammonium stearate, triethanolammonium linoleate, triethanolammonium linolenate, triethanolammonium p-aminobenzoate, triethanolammonium p-toluenesulfonate, triethanolammonium benzenesulfonate, triethanolammonium monochloroacetate, triethanolammonium dichloroacetate, triethanolammonium trichloroacetate, triethanolammonium trifluoroacetate, triethanolammonium malonate, triethanolammonium sulfonate, triethanolammonium fumarate, triethanolammonium tartrate, triethanolammonium itaconate, triethanolammonium mesaconate, triethanolammonium citraconate, triethanolammonium malate, and triethanolammonium glutarate.

Examples of the compounds represented by the general formula (6) include pyridinium hydroxide, pyridinium chloride, pyridinium bromide, pyridinium iodide, pyridinium fluoride, pyridinium nitrate, pyridinium sulfate, pyridinium hydrogensulfate, pyridinium phosphate, pyridinium carbonate, pyridinium phenolate, pyridinium acetate, pyridinium adipate, pyridinium alginate, pyridinium benzoate, pyridinium citrate, pyridinium formate, pyridinium hydrogencarbonate, pyridinium phthalate, pyridinium salicylate, pyridinium succinate, pyridinium maleate, pyridinium propionate, pyridinium butanate, pyridinium pentanoate, pyridinium hexanoate, pyridinium heptanoate, pyridinium octanoate, pyridinium nonanoate, pyridinium decanoate, pyridinium oxalate, pyridinium methylmalonate, pyridinium sebacate, pyridinium gallate, pyridinium butyrate, pyridinium mellitate, pyridinium arachidonate, pyridinium shikimate, pyridinium 2-ethylhexanoate, pyridinium oleate, pyridinium stearate, pyridinium linoleate, pyridinium linolenate, pyridinium p-aminobenzoate, pyridinium p-toluenesulfonate, pyridinium benzenesulfonate, pyridinium monochloroacetate, pyridinium dichloroacetate, pyridinium trichloroacetate, pyridinium trifluoroacetate, pyridinium malonate, pyridinium sulfonate, pyridinium fumarate, pyridinium tartrate, pyridinium itaconate, pyridinium mesaconate, pyridinium citraconate, pyridinium malate, pyridinium glutarate;

quinolinium hydroxide, quinolinium chloride, quinolinium bromide, quinolinium iodide, quinolinium fluoride, quinolinium nitrate, quinolinium sulfate, quinolinium hydrogensulfate, quinolinium phosphate, quinolinium carbonate, quinolinium phenolate, quinolinium acetate, quinolinium adipate, quinolinium alginate, quinolinium benzoate, quinolinium citrate, quinolinium formate, quinolinium hydrogencarbonate, quinolinium phthalate, quinolinium salicylate, quinolinium succinate, quinolinium maleate, quinolinium propionate, quinolinium butanate, quinolinium pentanoate, quinolinium hexanoate, quinolinium heptanoate, quinolinium octanoate, quinolinium nonanoate, quinolinium decanoate, quinolinium oxalate, quinolinium methylmalonate, quinolinium sebacate, quinolinium gallate, quinolinium butyrate, quinolinium mellitate, quinolinium arachidonate, quinolinium shikimate, quinolinium 2-ethylhexanoate, quinolinium oleate, quinolinium stearate, quinolinium linoleate, quinolinium linolenate, quinolinium p-aminobenzoate, quinolinium p-toluenesulfonate, quinolinium benzenesulfonate, quinolinium monochloroacetate, quinolinium dichloroacetate, quinolinium trichloroacetate, quinolinium trifluoroacetate, quinolinium malonate, quinolinium sulfonate, quinolinium fumarate, quinolinium tartrate, quinolinium itaconate, quinolinium mesaconate, quinolinium citraconate, quinolinium malate, quinolinium glutarate;

piperidinium hydroxide, piperidinium chloride, piperidinium bromide, piperidinium iodide, piperidinium fluoride, piperidinium nitrate, piperidinium sulfate, piperidinium hydrogensulfate, piperidinium phosphate, piperidinium carbonate, piperidinium phenolate, piperidinium acetate, piperidinium adipate, piperidinium alginate, piperidinium benzoate, piperidinium citrate, piperidinium formate, piperidinium hydrogencarbonate, piperidinium phthalate, piperidinium salicylate, piperidinium succinate, piperidinium maleate, piperidinium propionate, piperidinium butanate, piperidinium pentanoate, piperidinium hexanoate, piperidinium heptanoate, piperidinium octanoate, piperidinium nonanoate, piperidinium decanoate, piperidinium oxalate, piperidinium methylmalonate, piperidinium sebacate, piperidinium gallate, piperidinium butyrate, piperidinium mellitate, piperidinium arachidonate, piperidinium shikimate, piperidinium 2-ethylhexanoate, piperidinium oleate, piperidinium stearate, piperidinium linoleate, piperidinium linolenate, piperidinium p-aminobenzoate, piperidinium p-toluenesulfonate, piperidinium benzenesulfonate, piperidinium monochloroacetate, piperidinium dichloroacetate, piperidinium trichloroacetate, piperidinium trifluoroacetate, piperidinium malonate, piperidinium sulfonate, piperidinium fumarate, piperidinium tartrate, piperidinium itaconate, piperidinium mesaconate, piperidinium citraconate, piperidinium malate, piperidinium glutarate;

piperazinium hydroxide, piperazinium chloride, piperazinium bromide, piperazinium iodide, piperazinium fluoride, piperazinium nitrate, piperazinium sulfate, piperazinium hydrogensulfate, piperazinium phosphate, piperazinium carbonate, piperazinium phenolate, piperazinium acetate, piperazinium adipate, piperazinium alginate, piperazinium benzoate, piperazinium citrate, piperazinium formate, piperazinium hydrogencarbonate, piperazinium phthalate, piperazinium salicylate, piperazinium succinate, piperazinium maleate, piperazinium propionate, piperazinium butanate, piperazinium pentanoate, piperazinium hexanoate, piperazinium heptanoate, piperazinium octanoate, piperazinium nonanoate, piperazinium decanoate, piperazinium oxalate, piperazinium methylmalonate, piperazinium sebacate, piperazinium gallate, piperazinium butyrate, piperazinium mellitate, piperazinium arachidonate, piperazinium shikimate, piperazinium 2-ethylhexanoate, piperazinium oleate, piperazinium stearate, piperazinium linoleate, piperazinium linolenate, piperazinium p-aminobenzoate, piperazinium p-toluenesulfonate, piperazinium benzenesulfonate, piperazinium monochloroacetate, piperazinium dichloroacetate, piperazinium trichloroacetate, piperazinium trifluoroacetate, piperazinium malonate, piperazinium sulfonate, piperazinium fumarate, piperazinium tartrate, piperazinium itaconate, piperazinium mesaconate, piperazinium citraconate, piperazinium malate, piperazinium glutarate;

diazabicyclooctane hydrochloride, diazabicyclooctane oxalate, diazabicyclooctane nitrate, diazabicyclooctane sulfate, diazabicyclooctane hydrogensulfate, diazabicyclooctane carbonate, diazabicyclooctane hydrogencarbonate, diazabicyclooctane acetate, diazabicyclooctane maleate, diazabicyclooctane phthalate, diazabicyclooctane oxalate, diazabicyclooctane itaconate, diazabicyclooctane malonate, diazabicyclooctane formate, diazabicyclooctane butyrate, diazabicyclooctane malate;

diazabicyclononane hydrochloride, diazabicyclononane oxalate, diazabicyclononane nitrate, diazabicyclononane sulfate, diazabicyclononane hydrogensulfate, diazabicyclononane carbonate, diazabicyclononane hydrogencarbonate;

diazabicyclononane acetate, diazabicyclononane maleate, diazabicyclononane phthalate, diazabicyclononane oxalate, diazabicyclononane itaconate, diazabicyclononane malonate, diazabicyclononane formate, diazabicyclononane butyrate, diazabicyclononane malate; and diazabicycloundecene hydrochloride, diazabicycloundecene oxalate, diazabicycloundecene nitrate, diazabicycloundecene sulfate, diazabicycloundecene hydrogensulfate, diazabicycloundecene carbonate, diazabicycloundecene hydrogencarbonate, diazabicycloundecene acetate, diazabicycloundecene maleate, diazabicycloundecene phthalate, diazabicycloundecene oxalate, diazabicycloundecene itaconate, diazabicycloundecene malonate, diazabicycloundecene formate, diazabicycloundecene butyrate, and diazabicycloundecene malate.

Of those, ammonium hydroxide compounds and ammonium carboxylate compounds are preferable.

The ammonium compound is used in an amount of generally from 0.00001 to 10 mol, preferably from 0.00005 to 5 mol, more preferably from 0.001 to 1 mol, most preferably from 0.01 to 0.5 mol, per mol of the total amount of the $R^1O-$, $R^2O-$, $R^4O-$, and $R^5O-$ groups contained in the compounds (1) to (3). As long as the specific basic compound is used in an amount within that range, polymer precipitation or gelatin is less apt to occur during the reaction.

The radius of gyration of the product of hydrolysis and condensation (A) thus obtained is preferably from 5 to 50 nm, more preferably from 8 to 40 nm, most preferably from 9 to 20 nm, in terms of radius of gyration determined by the GPC (refractive index, viscosity, or light scattering) method. When the product of hydrolysis and condensation has a radius of gyration of from 5 to 50 nm, the composition can give a silica-based film excellent especially in dielectric constant, modulus of elasticity, and evenness of the film.

The product of hydrolysis and condensation (A) thus obtained is characterized by being not particulate and hence having excellent applicability to substrates. That the product of hydrolysis and condensation (A) is not particulate can be ascertained through examination with, e.g., a transmission electron microscope (TEM).

In ingredient (A), the proportion of the product of hydrolysis and condensation derived from each compound is as follows, in terms of the product of complete hydrolysis and condensation. The content of the product of hydrolysis and condensation derived from the compound (2) is generally from 5 to 75% by weight, preferably from 10 to 70% by weight, more preferably from 15 to 70% by weight, based on the sum of all the products of hydrolysis and condensation derived from the compounds (1) to (3). The content of the product of hydrolysis and condensation derived from the compound (1) and/or compound (3) is generally from 95 to 25% by weight, preferably from 90 to 30% by weight, more preferably from 85 to 30% by weight, based on the sum of all the products of hydrolysis and condensation derived from the compounds (1) to (3). When the content of the product of hydrolysis and condensation derived from the compound (2) is from 5 to 75% by weight based on the sum of all the products of hydrolysis and condensation derived from the compounds (1) to (3), then the coating film obtained has a high modulus of elasticity and an exceedingly low dielectric constant.

The term "product of complete hydrolysis and condensation" as used herein means a product in which all the $R^1O$—, $R^2O$—, $R^4O$—, and $R^5O$— groups contained in the compound (1), (2), or (3) have been hydrolyzed into SiOH groups and then completely condensed to form siloxane structures.

Ingredient (A) is preferably a product of the hydrolysis and condensation of a mixture of at least one of the compounds (1) and at least one of the compounds (2), because this ingredient (A) imparts better storage stability to the composition to be obtained.

In producing a product of hydrolysis and condensation (A), at least one silane compound selected from the group consisting of compounds (1) to (3) is hydrolyzed and condensed in the presence of a specific basic compound so that the resultant product of hydrolysis and condensation preferably has a radius of gyration of from 5 to 50 nm. It is preferred to adjust the pH of the resultant composition to 7 or lower.

Examples of techniques for pH adjustment include:
(1) to add a pH regulator;
(2) to distill off the specific basic compound from the composition at ordinary or reduced pressure;
(3) to bubble a gas such as nitrogen or argon into the composition to thereby remove the specific basic compound from the composition;
(4) to remove the specific basic compound from the composition with an ion-exchange resin; and
(5) to remove the specific basic compound from the system by extraction or washing.

Those techniques may be used alone or in combination of two or more thereof.

Examples of the pH regulator include inorganic acids and organic acids.

Examples of the inorganic acids include hydrochloric acid, nitric acid, sulfuric acid, hydrofluoric acid, phosphoric acid, boric acid, and oxalic acid.

Examples of the organic acids include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acids, phthalic acid, fumaric acid, citric acid, tartaric acid, succinic acid, itaconic acid, mesaconic acid, citraconic acid, malic acid, a glutaric acid hydrolyzate, a maleic anhydride hydrolyzate, and a phthalic anhydride hydrolyzate.

Those compounds may be used alone or in combination of two or more thereof.

Such a pH regulator is used to adjust the pH of the composition to 7 or lower, preferably 1 to 6. The method described above which comprises regulating the radius of gyration of the product of hydrolysis and condensation to from 5 to 50 nm and then adjusting the pH thereof with the pH regulator to a value within that range produces the effect that the composition obtained has improved storage stability.

The pH regulator is used in an amount suitably selected so that the pH of the composition becomes a value within that range.

Organic Solvent (B)

The composition for film formation of the invention comprises ingredient (A) usually dissolved or dispersed in an organic solvent (B).

This organic solvent (B) may comprise at least one member selected from the group consisting of alcohol solvents, ketone solvents, amide solvents, ester solvents, and aprotic solvents.

Examples of the alcohol solvents include monohydric alcohols such as methanol, ethanol, n-propanol, isopropanol, n-butanol, isobutanol, sec-butanol, t-butanol, n-pentanol, isopentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecylalcohol, trimethylnonyl alcohol, sec-tetradecyl alcohol, sec-heptadecyl alcohol, phenol, cyclohexanol, methylcyclohexanol,: 3,3,5-trimethylcyclohexanol, benzyl alcohol, and diacetone alcohol;

polyhydric alcohols such as ethylene glycol, 1,2-propylene glycol, 1,3-butylene glycol, pentanediol-2,4,2-methylpentanediol-2,4, hexanediol-2,5, heptanediol-2,4, 2-ethylhexanediol-1,3, diethylene glycol, dipropylene glycol, triethylene glycol, and tripropylene glycol; and partial ethers of polyhydric alcohols, such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, and dipropylene glycol monopropyl ether.

Those alcohol solvents may be used alone or in combination of two or more thereof.

Examples of the ketone solvents include acetone, methyl ethyl ketone, methyl n-propyl ketone, methyl n-butyl ketone, diethyl ketone, methyl isobutyl ketone, methyl n-pentyl ketone, ethyl n-butyl ketone, methyl n-hexyl ketone, diisobutyl ketone, trimethylnonanone, cyclohexanone, 2-hexanone, methylcyclohexanone, 2,4-pentanedione, acetonylacetone, acetophenone, and fenchone. Examples thereof further include β-diketones such as acetylacetone, 2,4-hexanedione, 2,4-heptanedione, 3,5-heptanedione, 2,4-octanedione, 3,5-octanedione, 2,4-nonanedione, 3,5-nonanedione, 5-methyl-2,4-hexanedione, 2,2,6,6-tetramethyl-3,5-heptanedione, and 1,1,1,5,5,5-hexafluoro-2,4-heptanedione.

Those ketone solvents may be used alone or in combination of two or more thereof.

Examples of the amide solvents include formamide, N-methylformamide, N,N-dimethylformamide, N-ethylformamide, N,N-diethylformamide, acetamide, N-methylacetamide, N,N-dimethylacetamide, N-ethylacetamide, N,N-diethylacetamide, N-methylpropionamide, N-methylpyrrolidone, N-formylmorpholine, N-formylpiperidine, N-formylpyrrolidine, N-acetylmorpholine, N-acetylpiperidine, and N-acetylpyrrolidine.

Those amide solvents may be used alone or in combination of two or more thereof.

Examples of the ester solvents include diethyl carbonate, ethylene carbonate, propylene carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, and diethyl phthalate.

Those ester solvents may be used alone or in combination of two or more thereof.

Examples of the aprotic solvents include acetonitrile, dimethyl sulfoxide, N,N,N',N'-tetraethylsulfamide, hexamethylphosphoric triamide, N-methylmorpholone, N-methylpyrrole, N-ethylpyrrole, N-methyl-Δ$^3$-pyrroline, N-methylpiperidine, N-ethylpiperidine, N,N-dimethylpiperazine, N-methylimidazole, N-methyl-4-piperidone, N-methyl-2-piperidone, N-methyl-2-pyrrolidone, 1,3-dimethyl-2-imidazolidinone, and 1,3-dimethyltetrahydro-2(1H)-pyrimidinone.

Especially preferred of the organic solvents enumerated above are organic solvents represented by the following formula (4):

$$R^8O(CHCH_3CH_2O)_eR^9 \qquad (4)$$

wherein $R^8$ and $R^9$ each independently represents a hydrogen atom or a monovalent organic group selected from the group consisting of alkyl groups having 1 to 4 carbon atoms and $CH_3CO$—; and e is an integer of 1 or 2.

Those organic solvents may be used alone or as a mixture of two or more thereof.

In hydrolyzing and condensing the compounds (1) to (3) in the invention, the same solvents as those enumerated above can be used.

An example of processes for producing the composition of the invention is as follows. Water or solvent-diluted water is added intermittently or continuously to a solvent containing the compounds (1) to (3) dissolved therein. In this operation, a specific basic compound may be added beforehand to the solvent or may be dissolved or dispersed in the water prior to the addition of the water. The reaction temperature in this case is generally from 0 to 100° C., preferably from 15 to 90° C.

Other Additives

Ingredients such as colloidal silica, colloidal alumina, organic polymers, surfactants, silane coupling agents, radical generators, and triazene compounds may be added to the composition for film formation obtained in the invention.

The colloidal silica is a dispersion comprising, for example, any of the aforementioned hydrophilic organic solvents and high-purity silicic acid anhydride dispersed therein. It has an average particle diameter of generally from 5 to 30 nm, preferably from 10 to 20 nm, and a solid concentration of generally about from 10 to 40% by weight. Examples of the colloidal silica include the methanol silica sol and isopropanol silica sol manufactured by Nissan Chemical Industries, Ltd. and Oscal, manufactured by Catalysts & Chemicals Industries Co., Ltd.

Examples of the colloidal alumina include Alumina Sol 520, 100, and 200, manufactured by Nissan Chemical Industries, Ltd., and Alumina Clear Sol and Alumina Sol 10 and 132, manufactured by Kawaken Fine Chemicals Co., Ltd.

Examples of the organic polymers include compounds having a sugar chain structure, vinyl amide polymers, (meth) acrylic polymers, aromatic vinyl compounds, dendrimers, polyimides, poly(amic acid)s, polyarylenes, polyamides, polyquinoxaline, polyoxadiazole, fluoropolymers, and compounds having a poly(alkylene oxide) structure.

Examples of the compounds having a poly(alkylene oxide) structure include compounds having a poly(methylene oxide) structure, poly(ethylene oxide) structure, poly(propylene oxide) structure, poly(tetramethylene oxide) structure, poly(butylene oxide) structure, or the like.

Specific examples thereof include ether type compounds such as polyoxymethylene alkyl ethers, polyoxyethylene alkyl ethers, polyoxyethylene alkylphenyl ethers, polyoxyethylene sterol ethers, polyoxyethylene lanolin derivatives, ethylene oxide derivatives of alkylphenol formalin condensates, polyoxyethylene/polyoxypropylene block copolymers, and polyoxyethylene/polyoxypropylene alkyl ethers; ether-ester type compounds such as polyoxyethylene glycerol fatty acid esters, polyoxyethylene sorbitan fatty acid esters, polyoxyethylene sorbitol fatty acid esters, and polyoxyethylene fatty acid alkanolamide sulfuric acid salts; and ether-ester type compounds such as polyethylene glycol fatty acid esters, ethylene glycol fatty acid esters, fatty acid monoglycerides, polyglycerol fatty acid esters, sorbitan fatty acid esters, propylene glycol fatty acid esters, and, sucrose fatty acid esters.

Examples of the polyoxyethylene/polyoxypropylene block copolymers include compounds having either of the following block structures:

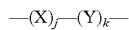

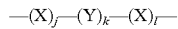

wherein X represents —CH$_2$CH$_2$O—; Y represents —CH$_2$CH(CH$_3$)O—; j is a number of 1 to 90; k is a number of 10 to 99; and l is a number of 0 to 90.

More preferred of those compounds enumerated above are ether type compounds such as polyoxyethylene alkyl ethers, polyoxyethylene/polyoxypropylene block copolymers, polyoxyethylene/polyoxypropylene alkyl ethers, polyoxyethylene glycerol fatty acid esters, polyoxyethylene sorbitan fatty acid esters, and polyoxyethylene sorbitol fatty acid esters.

Those compounds may be used alone or in combination of two or more thereof.

Examples of the surfactants include nonionic surfactants, anionic surfactants, cationic surfactants, and amphoteric surfactants, and further include fluorochemical surfactants, silicone surfactants, poly(alkylene oxide) surfactants, and poly(meth)acrylate surfactants. Preferred of these are fluorochemical surfactants and silicone surfactants.

The fluorochemical surfactants are ones comprising a compound having a fluoroalkyl or fluoroalkylene group in at least one position selected from the ends, main chain, and side chains. Examples thereof include 1,1,2,2-tetrafluorooctyl 1,1,2,2-tetrafluoropropyl ether, 1,1,2,2-tetrafluorooctyl hexyl ether, octaethylene glycol di(1,1,2,2-tetrafluorobutyl) ether, hexaethylene glycol 1,1,2,2,3,3-hexafluoropentyl ether, octapropylene glycol di(1,1,2,2-tetrafluorobutyl) ether, hexapropylene glycol di(1,1,2,2,3,3-hexafluoropentyl) ether, sodium perfluorododecylsulfonate, 1,1,2,2,8,8,9,9,10,10-decafluorododecane, 1,1,2,2,3,3-hexafluorodecane, N-[3-perfluorooctanesulfonamido)propyl]-N,N'-dimethyl-N-carboxymethylene ammonium betaine, perfluoroalkylsulfonamidopropyltrimethyl ammonium salts, perfluoroalkyl-N-ethylsulfonyl glycine salts, bis(N-perfluorooctylsulfonyl-N-ethylaminoethyl) phosphate, and monoperfluoroalkylethyl phosphates.

Commercially available products of such fluorochemical surfactants include products available under the trade names of Megafac F142D, F172, F173, and F183 (manufactured by Dainippon Ink & Chemicals, Inc.); F-Top EF301, EF303, and EF352 (manufactured by New Akita Chemical Company); Fluorad FC-430 and FC-431 (manufactured by Sumitomo 3M Ltd.); Asahi Guard AG710 and Surflon S-382, SC-101, SC-102, SC-103, SC-104, SC-105, and SC-106 (manufactured by Asahi Glass Co., Ltd.); BM-1000 and BM-1100 (manufactured by Yusho K.K.); and NBX-15 (manufactured by NEOS Co., Ltd.). Especially preferred of these are Megafac F172, BM-1000, BM-1100, and NBX-15.

Examples of the silicone surfactants include SH7PA, SH21PA, SH30PA, and ST94PA (all manufactured by Dow Corning Toray Silicone Co., Ltd.). Especially preferred of these are SH28PA and SH30PA.

The amount of such a surfactant to be used is usually from 0.0001 to 10 parts by weight per 100 parts by weight of ingredient (A) (in terms of the product of complete hydrolysis and condensation).

Those surfactants may be used alone or in combination of two or more thereof.

Examples of the silane coupling agents include 3-glycidyloxypropyltrimethoxysilane, 3-aminoglycidyloxypropyltriethoxysilane, 3-methacryloxypropyltrimethoxysilane, 3-glycidyloxypropylmethyldimethoxysilane, 1-methacryloxypropylmethyldimethoxysilane, 3-aminopropyltrimethoxysilane, 3-aminopropyltriethoxysilane, 2-aminopropyltrimethoxysilane, 2-aminopropyltriethoxysilane, N-(2-aminoethyl)-3-aminopropyltrimethoxysilane, N-(2-aminoethyl)-3-aminopropylmethyldimethoxysilane, 3-ureidopropyltrimethoxysilane, 3-ureidopropyltriethoxysilane, N-ethoxycarbonyl-3-aminopropyltrimethoxysilane, N-ethoxycarbonyl-3-aminopropyltriethoxysilane, N-triethoxysilylpropyltriethylenetriamine, N-trimethoxysilylpropyltriethylenetriamine, 10-trimethoxysilyl-1,4,7-triazadecane, 10-triethoxysilyl-1,4,7-triazadecane, 9-trimethoxysilyl-3,6-diazanonyl acetate, 9-triethoxysilyl-3,6-diazanonyl acetate, N-benzyl-3-aminopropyltrimethoxysilane, N-benzyl-3-aminopropyltriethoxysilane, N-phenyl-3-aminopropyltrimethoxysilane, N-phenyl-3-aminopropyltriethoxysilane, N-bis(oxyethylene)-3-aminopropyltrimethoxysilane, and N-bis(oxyethylene)-3-aminopropyltriethoxysilane.

Those silane coupling agents may be used alone or in combination of two or more thereof.

Examples of the radical generators include isobutyryl peroxide, α,α'-bis(neodecanoylperoxy)diisopropylbenzene, cumyl peroxyneodecanoate, di-n-propyl peroxydicarbonate, diisopropyl peroxydicarbonate, 1,1,3,3-tetramethylbutyl peroxyneodecanoate, bis(4-t-butylcyclohexyl) peroxydicarbonate, 1-cyclohexyl-1-methylethyl peroxyneodecanoate, di-2-ethoxyethyl peroxydicarbonate, di-2-ethylhexyl peroxydicarbonate, t-hexyl peroxyneodecanoate, dimethoxybutyl peroxydicarbonate, di(3-methyl-3-methoxybutyl) peroxydicarbonate, t-butyl peroxyneodecanoate, 2,4-dichlorobenzoyl peroxide, t-hexyl peroxypivalate, t-butyl peroxypivalate, 3,5,5-trimethylhexanoyl peroxide, octanoyl peroxide, lauroyl peroxide, stearoyl peroxide, 1,1,3,3-tetramethylbutyl peroxy-2-ethylhexanoate, succinic peroxide, 2,5-dimethyl-2,5-di(2-ethylhexanoylperoxy)hexane, 1-cyclohexyl-1-methylethyl peroxy-2-ethylhexanoate, t-hexyl peroxy-2-ethylhexanoate, t-butyl peroxy-2-ethylhexanoate, m-toluoyl benzoyl peroxide, benzoyl peroxide, t-butyl peroxyisobutyrate, di-t-butylperoxy-2-methylcyclohexane, 1,1-bis(t-hexylperoxy)-3,3,5-trimethylcyclohexane, 1,1-bis(t-hexylperoxy)cyclohexane, 1,1-bis(t-butylperoxy)-3,3,5-trimethylcyclohexane, 1,1-bis(t-butylperoxy)cyclohexane, 2,2-bis(4,4-di-t-butylperoxycyclohexyl)propane, 1,1-bis(t-butylperoxy)cyclodecane, t-hexyl peroxyisopropylmonocarbonate, t-butyl peroxymaleate, t-butyl peroxy-3,3,5-trimethylhexanoate, t-butyl peroxylaurate, 2,5-dimethyl-2,5-di(m-toluoylperoxy)hexane, t-butyl peroxyisopropylmonocarbonate, t-butyl peroxy-2-ethylhexylmonocarbonate, t-hexyl peroxybenzoate, 2,5-dimethyl-2,5-di(benzoylperoxy)hexane, t-butyl peroxyacetate, 2,2-bis(t-butylperoxy)butane, t-butyl peroxybenzoate, n-butyl 4,4-bis(t-butylperoxy)valerate, di-t-butyl peroxyisophthalate, α,α'-bis(t-butylperoxy)diisopropylbenzene, dicumyl peroxide, 2,5-dimethyl-2,5-di(t-butylperoxy)hexane, t-butylcumyl peroxide, di-t-butyl peroxide, p-menthane hydroperoxide, 2,5-dimethyl-2,5-di(t-butylperoxy)hexyne-3, diisopropylbenzene hydroperoxide, t-butyl trimethylsilyl peroxide, 1,1,3,3-tetramethylbutyl hydroperoxide, cumene hydroperoxide, t-hexyl hydroperoxide, t-butyl hydroperoxide, and 2,3-dimethyl-2,3-diphenylbutane.

The amount of such a radial generator to be added is preferably from 0.1 to 10 parts by weight per 100 parts by weight of the polymer.

Those radical generators may be used alone or in combination of two or more thereof.

Examples of the triazene compounds include 1,2-bis(3,3-dimethyltriazenyl)benzene, 1,3-bis(3,3-dimethyltriazenyl)benzene, 1,4-bis(3,3-dimethyltriazenyl)benzene, bis(3,3-dimethyltriazenylphenyl)ether, bis(3,3-dimethyltriazenylphenyl)methane, bis(3,3-dimethyltriazenylphenyl)sulfone, bis(3,3-dimethyltriazenylphenyl)sulfide, 2,2-bis[4-(3,3-dimethyltriazenylphenoxy)phenyl]-1,1,1,3,3,3-hexafluoropropane, 2,2-bis[4-(3,3-dimethyltriazenylphenoxy)phenyl]propane, 1,3,5-tris(3,3-dimethyltriazenyl)benzene, 2,7-bis(3,3-dimethyltriazenyl)-9,9-bis[4-(3,3-dimethyltriazenyl)phenyl]fluorene, 2,7-bis(3,3-dimethyltriazenyl)-9,9-bis[3-methyl-4-(3,3-dimethyltriazenyl)phenyl]fluorene, 2,7-bis(3,3-dimethyltriazenyl)-9,9-bis[3-phenyl-4-(3,3-dimethyltriazenyl)phenyl]fluorene, 2,7-bis(3,3-dimethyltriazenyl)-9,9-bis[3-propenyl-4-(3,3-dimethyltriazenyl)phenyl]fluorene, 2,7-bis(3,3-dimethyltriazenyl)-9,9-bis[3-fluoro-4-(3,3-dimethyltriazenyl)phenyl]fluorene, 2,7-bis(3,3-dimethyltriazenyl)-9,9-bis[3,5-difluoro-4-(3,3-dimethyltriazenyl)phenyl]fluorene, and 2,7-bis(3,3-dimethyltriazenyl)-9,9-bis [3-trifluoromethyl-4-(3,3-dimethyltriazenyl)phenyl]fluorene.

Those triazene compounds may be used alone or in combination of two or more thereof.

Methods for Preparing the Composition for Film Formation

Methods for preparing the composition for film formation of the invention are not particularly limited. For example, the composition may be prepared by mixing compounds (1) to (3) in a solvent, adding water thereto continuously or intermittently to conduct hydrolysis and condensation to prepare ingredient (A), and then adding ingredient (B) thereto.

Specific examples of methods for preparing the composition of the invention include the following methods 1) to 11).

1) A method in which a given amount of water is added to a mixture comprising compounds (1) to (3) for constituting ingredient (A), a specific basic compound, and an organic solvent to conduct hydrolysis and condensation reactions.

2) A method in which a given amount of water is added continuously or intermittently to a mixture comprising compounds (1) to (3) for constituting ingredient (A), a specific basic compound, and an organic solvent to conduct hydrolysis and condensation reactions.

3) A method in which given amounts of water and a specific basic compound are added to a mixture comprising compounds (1) to (3) for constituting ingredient (A) and an organic solvent to conduct hydrolysis and condensation reactions.

4) A method in which given amounts of water and a specific basic compound are added continuously or intermittently to a mixture comprising compounds (1) to (3) for constituting ingredient (A) and an organic solvent to conduct hydrolysis and condensation reactions.

5) A method in which a given amount of compounds (1) to (3) for constituting ingredient (A) are added to a mixture comprising an organic solvent, water, and a specific basic compound to conduct hydrolysis and condensation reactions.

6) A method in which a given amount of compounds (1) to (3) for constituting ingredient (A) are added continuously or intermittently to a mixture comprising an organic solvent, water, and a specific basic compound to conduct hydrolysis and condensation reactions.

7) A method in which a given amount of compounds (1) to (3) for constituting ingredient (A) are added to a mixture comprising an organic solvent, water, and a specific basic compound to conduct hydrolysis and condensation reactions, and a pH regulator is added to the resultant solution.

8) A method in which a given amount of compounds (1) to (3) for constituting ingredient (A) are added to a mixture comprising an organic solvent, water, and a specific basic compound to conduct hydrolysis and condensation reactions, and a pH regulator is added to the resultant solution after the solution is concentrated to a given concentration.

9) A method in which the solution obtained by any of methods 1) to 8) above is extracted with another organic solvent.

10) A method in which the organic solvent of the solution obtained by any of methods 1) to 8) above is replaced with another organic solvent.

11) A method in which the solution obtained by any of methods 1) to 8) above is extracted with another organic solvent, which is then replaced with another organic solvent.

The composition of the invention thus obtained has a total solid concentration of preferably from 2 to 30% by weight. The solid concentration thereof is suitably regulated according to the intended use thereof. When the composition has a total solid concentration of from 2 to 30% by weight, the composition not only gives a coating film having an appropriate thickness but has better storage stability.

The total solid concentration of the composition is regulated, according to need, by means of concentration or dilution with the organic solvent (B).

For applying the composition of the invention to a substrate such as a silicon wafer, $SiO_2$ wafer, or SiN wafer, use may be made of a coating technique such as spin coating, dip coating, roll coating, or spraying.

This coating operation can be conducted so as to form a coating film having a thickness on a dry basis of about from 0.05 to 2.5 µm in the case of single coating or about from 0.1 to 5.0 µm in the case of double coating. Thereafter, the wet coating film may be dried at ordinary temperature or dried with heating at a temperature of about from 80 to 600° C. usually for about from 5 to 240 minutes. Thus, a vitreous or macromolecular insulating film can be formed.

In this operation, heating can be conducted with a hot plate, oven, furnace, or the like, for example, in the air, in a nitrogen or argon atmosphere, under vacuum, or under reduced pressure having a control led oxygen concentration. Irradiation with electron beams or ultraviolet also can be used for forming a coating film.

In order to control the curing rate of the coating film, stepwise heating or a suitably selected atmosphere, such as a nitrogen, air, oxygen, or reduced-pressure atmosphere, can be used according to need.

The silica-based film of the invention thus obtained has a density of generally from 0.35 to 1.2 $g/cm^3$, preferably from 0.4 to 1.1 $g/cm^3$, more preferably from 0.5 to 1.0 $g/cm^3$. If the density of the film is lower than 0.35 $g/cm^3$, the coating film has impaired mechanical strength. On the other hand, if the density thereof exceeds 1.2 $g/cm^3$, a low dielectric constant cannot be obtained.

When the silica-based film of the invention is examined for pore size distribution by the BJH method, no pores of 10 nm or larger are observed therein. The film is hence suitable for use as an interlayer insulating film material for insulation between fine wirings.

Furthermore, the silica-based film of the invention is characterized by having low water absorption. For example, when the coating film is allowed to stand in an atmosphere of 127° C., 2.5 atm, and 100% RH for 1 hour, then no water adsorption on the coating film is observed by IR spectroscopy.

This water absorption can be regulated by controlling the amount of a tetraalkoxysilane used in the invention as a compound (1) in preparing the composition for film formation.

The silica-based film of the invention has a dielectric constant of generally from 2.6 to 1.2, preferably from 2.5 to 1.2, more preferably from 2.4 to 1.2.

The interlayer insulating film thus obtained is excellent in dielectric constant characteristics after a PCT, resistance to CMP after a PCT, and adhesion to substrates after a PCT. Consequently, this coating film is useful in applications such as interlayer insulating films or etching stopper films for semiconductor devices such as LSIs, system LSIs, DRAMs, SDRAMs, RDRAMs; and D-RDRAMs, protective films such as surface coat films for semiconductor devices, interlayers for use in semiconductor production processes employing a multilayered resist, interlayer insulating films for multilayered printed circuit boards, and protective or insulating films for liquid-crystal display devices.

The invention will be explained below in more detail by reference to the following Examples. However, the following description merely shows general embodiment examples of the invention, and it should be understood that the invention is not construed as being limited by the description without particular reasons.

In the following Examples and Comparative Examples, all "parts" and "percents" are by weight unless otherwise indicated.

Various properties were evaluated by the following methods.

Radius of Gyration

Measured by gel permeation chromatography (GPC) (refractive index, viscosity, or light scattering measurement) under the following conditions.

Sample solution: A product of the hydrolysis and condensation of silane compounds was diluted with methanol containing 10 mM LiBr to a solid concentration of 0.25% to prepare a sample solution for GPC (refractive index, viscosity, or light scattering measurement).

Apparatus:
GPC system: Model GPC-8020, manufactured by Tosoh Corp.
Column: Alpha 5000/3000, manufactured by Tosoh Corp.
Viscosity detector and light scattering detector:
Model T-60. Dual Meter, manufactured by Visco Tech Co.
Carrier solution: methanol containing 110 mM LiBr
Carrier feed rate: 1 ml/min
Column temperature: 40° C.

Temperature Dependence of Dielectric Constant

The composition sample was applied to an 8-inch silicon wafer by spin coating. The coated substrate was dried on a hot plate first at 80° C. for 2 minutes and subsequently in a nitrogen atmosphere at 200° C. for 2 minutes, and was then burned on a 415° C. hot plate in a nitrogen atmosphere for 30 minutes. The film obtained was subjected to a surface treatment with a silicon compound as shown in Example. On this film was formed an aluminum electrode pattern by vapor deposition. Thus, a sample for dielectric constant measurement was produced. The sample was let stand in a clean room at a temperature of 23° C. and a humidity of 50%, and then examined at a frequency of 100 kHz with electrodes HP16451B and a precision LCR meter HP4284A, both manufactured by Yokogawa-Hewlett-Packard, Ltd., by the CV method to determine the dielectric constant of the coating film.

Dielectric Constant after PCT

The composition sample was applied to an 8-inch silicon wafer by spin coating. The coated substrate was dried on a hot plate first at 80° C. for 2 minutes and subsequently in a nitrogen atmosphere at 200° C. for 2 minutes, and was then burned on a 420° C. hot plate in a vacuum for 24 minutes. The film obtained was subjected to a 1-hour PCT under the conditions of 110° C., 100% RH, and 2 atm. On this film was formed an aluminum electrode pattern by vapor deposition. Thus, a sample for dielectric constant measurement was produced. This sample was examined at a frequency of 100 kHz with the electrodes HP16451B and precision LCR meter HP4284A, both manufactured by Yokogawa-Hewlett-Packard, Ltd., by the CV method to determine the dielectric constant of the coating film.

Mechanical Strength of Coating Film (Modulus of Elasticity)

The composition sample was applied to an 8-inch silicon wafer by spin coating. The coated substrate was dried on a hot plate first at 80° C. for 2 minutes and subsequently in a nitrogen atmosphere at 200° C. for 3 minutes, and was then burned on a 420° C. hot plate in a vacuum for 25 minutes. The modulus of elasticity of the film obtained was measured with the Nano Indenter XP (manufactured by Nano Instruments, Inc.) by the continuous rigidity measurement method.

EXAMPLE 1

471 g of ethanol, 237 g of ion-exchanged water, and 17.2 g of a 25% aqueous tetramethylammonium hydroxide solution were introduced into a separable flask made of quartz. The contents were stirred and homogenized. A mixture of 44.9 g of methyltrimethoxysilane and 68.6 g of tetraethoxysilane was added to this solution. The resulting solution was reacted for 2 hours while maintaining at 55° C. 28 g of a 20% aqueous maleic acid solution and 440 g of propylene glycol monopropyl ether were added to this solution. The resulting solution was concentrated with a 50° C. evaporator until the concentration thereof reached 10% (in terms of the content of the product of complete hydrolysis and condensation). 300 g of ethyl acetate and 300 g of ion-exchanged water were added to the solution to conduct liquid-liquid extraction. The upper layer of the solution was taken out and further concentrated with a 50° C. evaporator until the concentration thereof reached 10% (in terms of the content of the product of complete hydrolysis and condensation) to obtain Reaction Solution (1).

The product of condensation and other reactions thus obtained had a radius of gyration of 20.3 nm.

The solution was filtered through a Teflon filter having an opening diameter of 0.2 μm to obtain a composition for film formation of the invention.

The composition obtained was applied to a silicon wafer by spin coating and heated to obtain a coating film. The Table shows the evaluation results of the coating film.

EXAMPLE 2

Reaction Solution (2) was obtained in the same manner as in Example 1 except for using a 25% aqueous ammonium acetate solution in place of a 25% aqueous tetramethylammonium hydroxide solution in Example 1.

The product of condensation and other reactions thus obtained had a radius of gyration of 17.5 nm.

This solution was evaluated in the same manner as in Example 1. The Table shows the evaluation results of the coating film.

EXAMPLE 3

Reaction Solution (3) was obtained in the same manner as in Example 1 except for using a 25% aqueous tetramethylammonium maleate solution in place of a 25% aqueous tetramethylammonium hydroxide solution in Example 1.

The product of condensation and other reactions thus obtained had a radius of gyration of 21.3 nm.

This solution was evaluated in the same manner as in Example 1. The Table shows the evaluation results of the coating film.

EXAMPLE 4

Reaction Solution (4) was obtained in the same manner as in Example 1 except for using a 25% aqueous pyridinium acetate solution in place of a 25% aqueous tetramethylammonium hydroxide solution in Example 1.

The product of condensation and other reactions thus obtained had a radius of gyration of 15.3 nm.

This solution was evaluated in the same manner as in Example 1. The Table shows the evaluation results of the coating film.

EXAMPLE 5

Reaction Solution (5) was obtained in the same manner as in Example 1 except for using a 25% aqueous diazabicycloundecene acetate solution in place of a 25% aqueous tetramethylammonium hydroxide solution in Example 1.

The product of condensation and other reactions thus obtained had a radius of gyration of 19.7 nm.

This solution was evaluated in the same manner as in Example 1. The Table shows the evaluation results of the coating film.

EXAMPLE 6

Reaction Solution (6) was obtained in the same manner as in Example 1 except for using a 25% aqueous tetramethylammonium chloride solution in place of a 25% aqueous tetramethylammonium hydroxide solution in Example 1.

The product of condensation and other reactions thus obtained had a radius of gyration of 18.7 nm.

This solution was evaluated in the same manner as in Example 1. The Table shows the evaluation results of the coating film.

COMPARATIVE EXAMPLE 1

Reaction Solution (7) was obtained in the same manner as in Example 1 except for using a 25% aqueous acetic acid solution in place of a 25% aqueous tetramethylammonium hydroxide solution in Example 1.

The product of condensation and other reactions thus obtained had a radius of gyration of 0.2 nm.

This solution was evaluated in the same manner as in Example 1. The Table shows the evaluation results of the coating film.

TABLE

|  | Reaction Solution | Temperature Dependence of Dielectric Constant | | Dielectric Constant After | Modulus of Elasticity(GPa) |
|---|---|---|---|---|---|
|  |  | 23° C. | 200° C. | PCT | of Coating Film |
| Example 1 | Reaction Solution (1) | 2.21 | 2.16 | 2.22 | 5.8 |
| Example 2 | Reaction Solution (2) | 2.33 | 2.36 | 2.35 | 6.5 |
| Example 3 | Reaction Solution (3) | 2.19 | 2.12 | 2.23 | 5.3 |
| Example 4 | Reaction Solution (4) | 2.44 | 2.40 | 2.46 | 8.5 |
| Example 5 | Reaction Solution (5) | 2.24 | 2.19 | 2.26 | 5.9 |
| Example 6 | Reaction Solution (6) | 2.28 | 2.24 | 2.29 | 6.1 |
| Comparative Example 1 | Reaction Solution (7) | 3.04 | 2.60 | 3.45 | 4.6 |

What is claimed is:

1. A composition for film formation which comprises:
   (A) a product of hydrolysis and condensation obtained by hydrolyzing and condensing at least one silane compound selected from the group consisting of compounds represented by the following formula (1) and at least one silane compound selected from the group consisting of compounds represented by the following formula (2), or
   a product of hydrolysis and condensation obtained by hydrolyzing and condensing at least one silane compound selected from the group consisting of compounds represented by the following formula (3), or a product of hydrolysis and condensation obtained by hydrolyzing and condensing combinations of at least one silane compound represented by formula (3) and at least one silane compound represented by formula (1) and/or at least one silane compound represented by formula (2);

and wherein the hydrolysis and condensation takes place in the presence of water and an ammonium compound, $$R_a Si(OR^1)_{4-a} \qquad (1)$$

wherein R represents a hydrogen atom, a fluorine atom, or a monovalent organic group; $R^1$ represents a monovalent organic group; and a is an integer of 1 or 2;

$$Si(OR^2)_4 \qquad (2)$$

wherein $R^2$ represents a monovalent organic group;

$$R^3{}_b(R^4O)_{3-b}Si\text{—}(R^7)_d\text{—}Si(OR^5)_{3-c}R^6{}_c \qquad (3)$$

wherein $R^3$ to $R^6$ may be the same or different, and each represents a monovalent organic group; b and c may be the same or different, and each is a number of 0 to 2; $R^7$ represents an oxygen atom, a phenylene group, or a group represented by —$(CH_2)_n$—, wherein n is an integer of 1 to 6; and (B) an organic solvent;

and wherein the ammonium compound is selected from the group consisting of tetramethylammonium maleate, pyridinium acetate, and diazobicycloundecene acetate.

2. The composition for film formation of claim 1, wherein the ammonium compound is used in an amount of from 0.0000 1 to 10 mol per mol of all the alkoxyl groups of the silane compound.

3. The composition for film formation of claim 1, which has a pH of 7 or lower.

4. The composition for film formation of claim 1, wherein the organic solvent (B) comprises a solvent represented by the following formula (4):

$$R^8O(CHCH_3CH_2O)_e R^9 \qquad (4)$$

wherein $R^8$ and $R^9$ each independently represents a hydrogen atom or a monovalent organic group selected from the group consisting of alkyl groups having 1 to 4 carbon atoms and $CH_3CO$—; and e is an integer of 1 or 2.

5. A method of film formation which comprises applying the composition for film formation of claim 1 to a substrate, and then heating the resultant coating.

6. A silica-based film obtained by the method of film formation of claim 7.

7. The composition for film formation as in claim 1, wherein (A) is a product of hydrolysis and condensation obtained by hydrolyzing and condensing at least one silane of compound (1) and at least one silane of compound (2).

8. The composition for film formation as in claim 1, wherein (A) is a product of hydrolysis and condensation obtained by hydrolyzing and condensing at least one silane of compound (3).

* * * * *